(12) United States Patent
Yada

(10) Patent No.: US 10,663,900 B2
(45) Date of Patent: May 26, 2020

(54) IMAGE FORMING APPARATUS, METHOD, AND COMPUTER-READABLE MEDIUM FOR CONTROLLING TIMINGS TO SUPPLY ELECTRIC POWER TO HEATERS

(71) Applicant: BROTHER KOGYO KABUSHIKI KAISHA, Nagoya-shi, Aichi-ken (JP)

(72) Inventor: Naoya Yada, Kuwana (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 11 days.

(21) Appl. No.: 16/193,095

(22) Filed: Nov. 16, 2018

(65) Prior Publication Data
US 2019/0302665 A1    Oct. 3, 2019

(30) Foreign Application Priority Data

Mar. 30, 2018  (JP) ................................ 2018-068042

(51) Int. Cl.
  *G03G 15/00*  (2006.01)
  *G03G 15/20*  (2006.01)
  *G01R 19/165*  (2006.01)

(52) U.S. Cl.
  CPC ..... *G03G 15/5004* (2013.01); *G03G 15/2039* (2013.01); *G01R 19/16528* (2013.01); *G03G 15/2064* (2013.01)

(58) Field of Classification Search
  CPC ........... G03G 15/2039; G03G 15/2064; G03G 15/5004; G01R 19/16528
  See application file for complete search history.

(56) References Cited

U.S. PATENT DOCUMENTS

| | | | | |
|---|---|---|---|---|
| 5,669,038 A | * | 9/1997 | Kishimoto | ......... G03G 15/2003 |
| | | | | 219/216 |
| 5,866,880 A | * | 2/1999 | Seitz | ..................... F24H 9/2028 |
| | | | | 219/483 |
| 6,037,757 A | * | 3/2000 | Oliveira | ............. G03G 15/2003 |
| | | | | 219/497 |
| 6,080,971 A | * | 6/2000 | Seitz | ..................... F24H 9/2028 |
| | | | | 219/483 |

(Continued)

FOREIGN PATENT DOCUMENTS

| | | |
|---|---|---|
| JP | 2004-226557 A | 8/2004 |
| JP | 2005-24779 A  | 1/2005 |

(Continued)

*Primary Examiner* — Francis C Gray
(74) *Attorney, Agent, or Firm* — Merchant & Gould P.C.

(57) ABSTRACT

An image forming apparatus includes a controller configured to begin to supply AC power to a first heater at a start of a first half-cycle of the AC power, begin to supply the AC power to a second heater at a first timing after beginning to supply the AC power to the first heater, in the first half-cycle, when an estimated combined peak current is more than a threshold, begin to supply the AC power to the second heater at a second timing in a second half-cycle next to the first half-cycle, the second timing satisfying that a time period between a start of the second half-cycle and the second timing is equal to a time period between the start of the first half-cycle and a timing from which the estimated combined current is equal to or less than the threshold until the end of the first half-cycle.

13 Claims, 7 Drawing Sheets

(56) References Cited

U.S. PATENT DOCUMENTS

| | | | |
|---|---|---|---|
| 6,301,454 B1 * | 10/2001 | Nishida | G03G 15/2003 |
| | | | 219/216 |
| 9,298,141 B2 * | 3/2016 | Itoh | G03G 15/80 |
| 2004/0146311 A1 | 7/2004 | Kawazu et al. | |
| 2006/0267515 A1 * | 11/2006 | Burke | H02M 5/293 |
| | | | 315/291 |
| 2007/0193998 A1 | 8/2007 | Ichino | |
| 2013/0266334 A1 * | 10/2013 | Shimura | G03G 15/2039 |
| | | | 399/69 |
| 2015/0253705 A1 * | 9/2015 | Shimura | G03G 15/2039 |
| | | | 399/33 |
| 2016/0139548 A1 * | 5/2016 | Kosaka | G03G 15/2039 |
| | | | 399/67 |

FOREIGN PATENT DOCUMENTS

| | | |
|---|---|---|
| JP | 2007-212536 A | 8/2007 |
| JP | 2008-164644 A | 7/2008 |
| JP | 2009-181059 A | 8/2009 |

\* cited by examiner

IMAGE FORMING APPARATUS, METHOD, AND COMPUTER-READABLE MEDIUM FOR CONTROLLING TIMINGS TO SUPPLY ELECTRIC POWER TO HEATERS

CROSS-REFERENCE TO RELATED APPLICATION

This application claims priority under 35 U.S.C. § 119 from Japanese Patent Application No. 2018-068042 filed on March 30, 2018. The entire subject matter of the application is incorporated herein by reference.

BACKGROUND

Technical Field

Aspects of the present disclosure are related to an image forming apparatus, a method, and a non-transitory computer-readable medium for controlling timings to supply electric power to heaters.

Related Art

Heretofore, for an image forming apparatus having a heater, a technique to restrict electric power to be supplied to the heater has been proposed. For instance, there has been disclosed a technique to set a fixed duty ratio under an assumption that the heater is supplied with a maximum suppliable voltage and has a minimum variable resistance value and to calculate a maximum duty ratio of electric power suppliable to the heater based on a detected value of an electric current flowing into the heater under control with the fixed duty ratio.

SUMMARY

In the meantime, there is a demand for a technique to shorten an FPOT ("FPOT" is an abbreviation of "First Print Out Time") while restricting the electric power to be supplied to the heater. It is noted that the FPOT is a period of time required until the image forming apparatus outputs a first printed sheet from issuance of a print request.

Aspects of the present disclosure are advantageous to provide one or more improved techniques, for an image forming apparatus having a heater, which make it possible to shorten an FPOT while restricting electric power to be supplied to the heater.

According to aspects of the present disclosure, an image forming apparatus is provided, which includes a first heater, a second heater electrically connected in parallel with the first heater, a current sensor electrically connected in series with the first heater and the second heater, and a controller. The controller is configured to begin to supply AC power from an AC power source to the first heater at a start of a first half-cycle of the AC power, thereby causing an alternating current, of which an absolute value is equal to or less than a threshold from the start until an end of the first half-cycle, to flow into the first heater, begin to supply the AC power to the second heater at a first particular timing after beginning to supply the AC power to the first heater, in the first half-cycle, the first particular timing being a timing from which a combined current is equal to or less than the threshold until the end of the first half-cycle, the combined current being a sum of absolute values of respective alternating currents flowing into the first heater and the second heater, calculate an estimated combined peak current, based on a signal output from the current sensor at a first detection timing later than the first particular timing in the first half-cycle and the first detection timing, the estimated combined peak current being a maximum value of an estimated combined current, the estimated combined current being a sum of absolute values of respective alternating currents estimated to flow into the first heater and the second heater when it is assumed that the first heater and the second heater are supplied with the AC power from the start until the end of the first half-cycle, determine whether the estimated combined peak current is equal to or less than the threshold, in response to determining that the estimated combined peak current is more than the threshold, begin to supply the AC power to the second heater at a second particular timing in a second half-cycle next to the first half-cycle, the second particular timing satisfying that a period of time between a start of the second half-cycle and the second particular timing is equal to a period of time between the start of the first half-cycle and a timing from which the estimated combined current is equal to or less than the threshold until the end of the first half-cycle, and in response to determining that the estimated combined peak current is equal to or less than the threshold, begin to supply the AC power to the second heater at the start of the second half-cycle.

According to aspects of the present disclosure, further provided is a method implementable on a processor coupled with an image forming apparatus. The image forming apparatus includes a first heater, a second heater electrically connected in parallel with the first heater, and a current sensor electrically connected in series with the first heater and the second heater. The method includes beginning to supply AC power from an AC power source to the first heater at a start of a first half-cycle of the AC power, thereby causing an alternating current, of which an absolute value is equal to or less than a threshold from the start until an end of the first half-cycle, to flow into the first heater, beginning to supply the AC power to the second heater at a first particular timing after beginning to supply the AC power to the first heater, in the first half-cycle, the first particular timing being a timing from which a combined current is equal to or less than the threshold until the end of the first half-cycle, the combined current being a sum of absolute values of respective alternating currents flowing into the first heater and the second heater, calculating an estimated combined peak current, based on a signal output from the current sensor at a first detection timing later than the first particular timing in the first half-cycle and the first detection timing, the estimated combined peak current being a maximum value of an estimated combined current, the estimated combined current being a sum of absolute values of respective alternating currents estimated to flow into the first heater and the second heater when it is assumed that the first heater and the second heater are supplied with the AC power from the start until the end of the first half-cycle, determining whether the estimated combined peak current is equal to or less than the threshold, in response to determining that the estimated combined peak current is more than the threshold, beginning to supply the AC power to the second heater at a second particular timing in a second half-cycle next to the first half-cycle, the second particular timing satisfying that a period of time between a start of the second half-cycle and the second particular timing is equal to a period of time between the start of the first half-cycle and a timing from which the estimated combined current is equal to or less than the threshold until the end of the first half-cycle, and in response to determining that the estimated combined peak current is equal to or less than the threshold, beginning to supply the AC power to the second heater at the start of the second half-cycle.

According to aspects of the present disclosure, further provided is a non-transitory computer-readable medium storing computer-readable instructions that are executable by a processor coupled with an image forming apparatus. The image forming apparatus includes a first heater, a second heater electrically connected in parallel with the first heater, and a current sensor electrically connected in series with the first heater and the second heater. The instructions are configured to, when executed by the processor, cause the processor to begin to supply AC power from an AC power source to the first heater at a start of a first half-cycle of the AC power, thereby causing an alternating current, of which an absolute value is equal to or less than a threshold from the start until an end of the first half-cycle, to flow into the first heater, begin to supply the AC power to the second heater at a first particular timing after beginning to supply the AC power to the first heater, in the first half-cycle, the first particular timing being a timing from which a combined current is equal to or less than the threshold until the end of the first half-cycle, the combined current being a sum of absolute values of respective alternating currents flowing into the first heater and the second heater, calculate an estimated combined peak current, based on a signal output from the current sensor at a first detection timing later than the first particular timing in the first half-cycle and the first detection timing, the estimated combined peak current being a maximum value of an estimated combined current, the estimated combined current being a sum of absolute values of respective alternating currents estimated to flow into the first heater and the second heater when it is assumed that the first heater and the second heater are supplied with the AC power from the start until the end of the first half-cycle, determine whether the estimated combined peak current is equal to or less than the threshold, in response to determining that the estimated combined peak current is more than the threshold, begin to supply the AC power to the second heater at a second particular timing in a second half-cycle next to the first half-cycle, the second particular timing satisfying that a period of time between a start of the second half-cycle and the second particular timing is equal to a period of time between the start of the first half-cycle and a timing from which the estimated combined current is equal to or less than the threshold until the end of the first half-cycle, and in response to determining that the estimated combined peak current is equal to or less than the threshold, begin to supply the AC power to the second heater at the start of the second half-cycle.

BRIEF DESCRIPTION OF THE ACCOMPANYING DRAWINGS

DETAILED DESCRIPTION

It is noted that various connections are set forth between elements in the following description. It is noted that these connections in general and, unless specified otherwise, may be direct or indirect and that this specification is not intended to be limiting in this respect. Aspects of the present disclosure may be implemented on circuits (such as application specific integrated circuits) or in computer software as programs storable on computer-readable media including but not limited to RAMs, ROMs, flash memories, EEPROMs, CD-media, DVD-media, temporary storage, hard disk drives, floppy drives, permanent storage, and the like.

Figure 1:
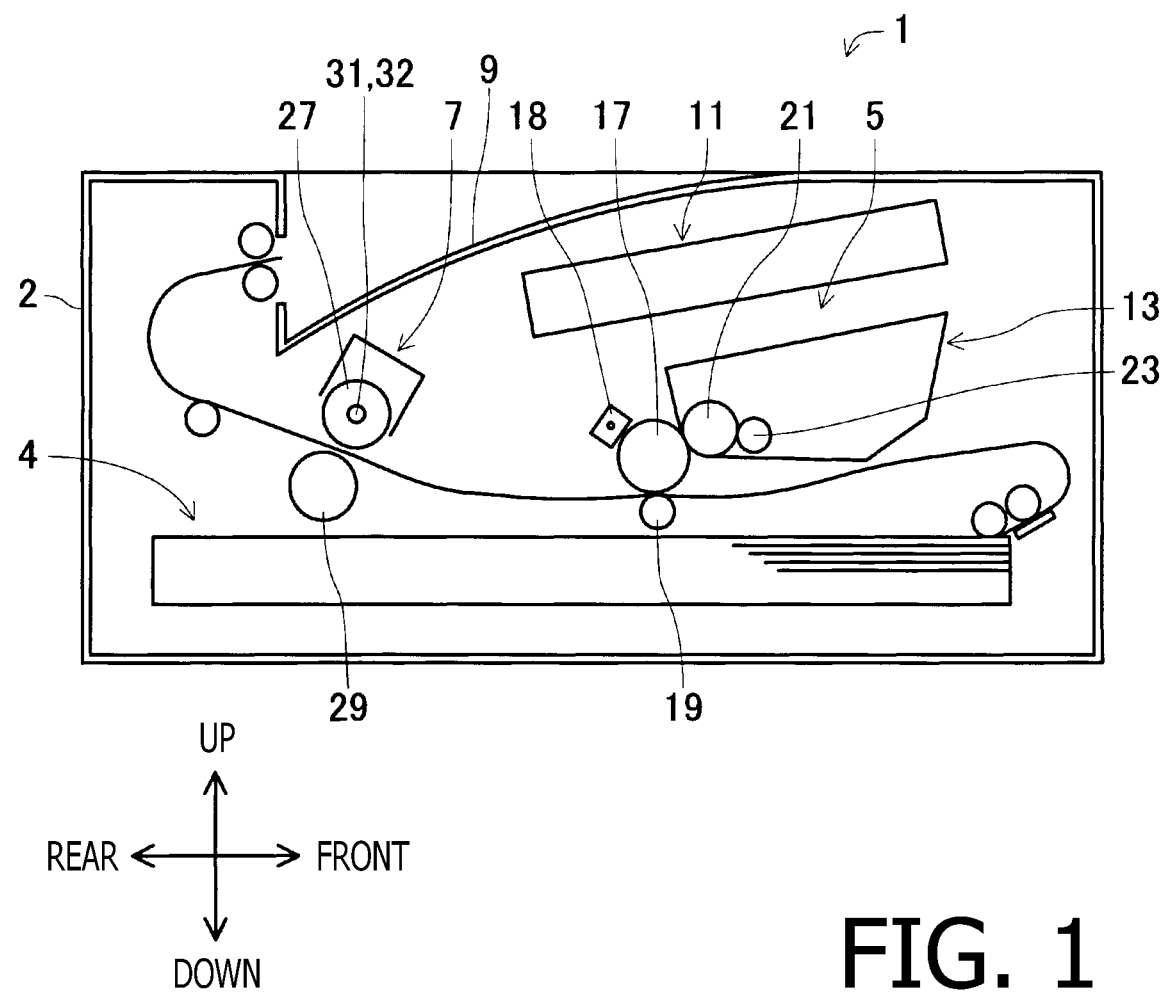
FIG. 1 is a cross-sectional side view of a printer in an illustrative embodiment according to one or more aspects of the present disclosure.

Hereinafter, an illustrative embodiment according to aspects of the present disclosure will be described with reference to the accompanying drawings. FIG. 1 is a cross-sectional side view of a printer 1 in the illustrative embodiment. The printer 1 is a monochrome laser printer. The printer 1 includes a main body casing 2, a tray 4, an image former 5, a fuser 7, and a discharge tray 9. The tray 4 is disposed at a lower portion inside the main body casing 2. The discharge tray 9 is formed on and above the main body casing 2. The printer 1 is configured to feed a sheet out of the tray 4, form a toner image on the sheet by the image former 5, then heat the toner image formed on the sheet by the fuser 7 thereby fixing the toner image onto the sheet, and finally discharge the printed sheet onto the discharge tray 9. It is noted that, in the following description, as shown in FIG. 1, a left side, a right side, an upper side, and a lower side of the figure will be defined as a rear side, a front side, an upside, and a downside of the printer 1, respectively. Further, a left-hand side (i.e., a near side relative to a flat surface on which the figure is drawn) and a right-hand side (i.e., a far side relative to the flat surface on which the figure is drawn) of the printer 1 when the printer 1 is viewed from the front side will be defined as a left side and a right side of the printer 1, respectively.

The image former 5 includes an image scanner 11, a development cartridge 13, a photoconductive drum 17, a charger 18, and a transfer roller 19. The image scanner 11 is disposed at an upper portion inside the main body casing 2. The image scanner 11 is configured to emit laser light from a laser emitter (not shown) and irradiate a surface of the photoconductive drum 17 with the laser light deflected via a polygon mirror (not shown), a reflecting mirror (not shown), and a lens (not shown), thereby scanning the surface of the photoconductive drum 17 at a high speed.

The development cartridge 13 is detachably attached to the main body of the printer 1. The development cartridge 13 stores toner therein. The development cartridge 13 includes a development roller 21 and a supply roller 23 that are opposed to each other. The development roller 21 is disposed to face the photoconductive drum 17. The toner stored in the development cartridge 13 is supplied to the development roller 21 via rotation of the supply roller 23, and is carried on the development roller 21.

The charger 18 is disposed on an upper rear side of the photoconductive drum 17. The charger 18 is spaced apart from the photoconductive drum 17. Beneath the photoconductive drum 17, the transfer roller 19 is disposed to face the photoconductive drum 17. While the photoconductive drum 17 is rotating, the surface of the photoconductive drum 17 is evenly charged by the charger 18. At this time, for instance, the surface of the photoconductive drum 17 may be positively charged. Subsequently, the charged surface of the photoconductive drum 17 is exposed to the laser light from the image scanner 11. Thereby, an electrostatic latent image is formed on the surface of the photoconductive drum 17. Afterward, when the toner carried on the development roller 21, which is rotating while contacting the photoconductive drum 17, is supplied to the electrostatic latent image formed on the surface of the photoconductive drum 17. Thereby, a toner image is formed on the surface of the photoconductive drum 17. The toner image formed on the surface of the photoconductive drum 17 is transferred onto a sheet by a transfer bias applied to the transfer roller 19, while the sheet is passing between the photoconductive drum 17 and the transfer roller 19.

The fuser 7 is disposed downstream (i.e., at a rear portion inside the printer 1) of the image former 5 in a sheet conveyance direction. The fuser 7 includes a fixing roller 27, a pressing roller 29, a main heater 31, and a sub heater 32. The pressing roller 29 is configured to press the fixing roller 27. The main heater 31 and the sub heater 32 are configured to heat the fixing roller 27. The fixing roller 27 is driven to rotate by an electric motor (not shown) that is controlled by a controller 33 of a heating device 30 (see FIG. 2). Further, the fixing roller 27 provides a conveyance force to the sheet while heating the toner transferred on the sheet. Meanwhile, the pressing roller 29 is driven to rotate along with a movement of the sheet conveyed by the conveyance force from the fixing roller 27, while pressing the sheet against the fixing roller 27. Each of the heaters 31 and 32 includes a halogen heater. Electric power to be supplied to each of the heaters 31 and 32 is controlled by the controller 33 of the heating device 30. The main heater 31 and the sub heater 32 are incorporated inside the fixing roller 27. Specifically, the main heater 31 is substantially disposed inside a middle portion of the fixing roller 27 in an axial direction of the fixing roller 27. Further, the sub heater 32 may be disposed inside at least one of both end portions of the fixing roller 27 in the axial direction of the fixing roller 27.

Figure 2:
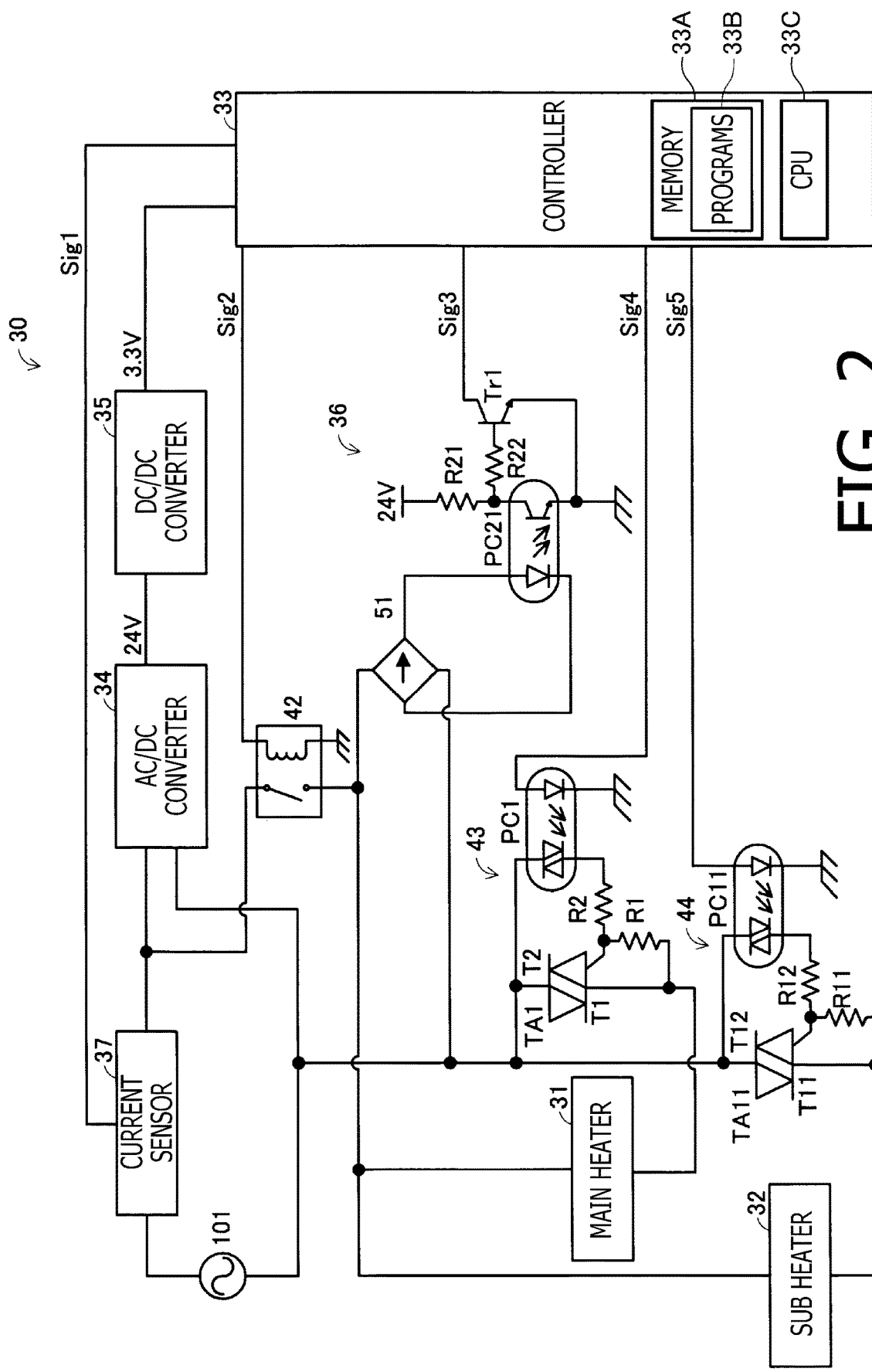
FIG. 2 is a circuit diagram of a heating device including a main heater and a sub heater, in the illustrative embodiment according to one or more aspects of the present disclosure.

As shown in FIG. 2, the heating device 30 includes the main heater 31, the sub heater 32, the controller 33, an AC/DC converter 34, a DC/DC converter 35, a zero-crossing detection circuit 36, a current sensor 37, a relay 42, and heater control circuits 43 and 44. For instance, the controller 33 may include a CPU 33C and a memory 33A storing programs 33B executable by the CPU 33C. Alternatively, for instance, the controller 33 may include one or more specific hardware elements such as ASICs. Further, for instance, the controller 33 may be configured to perform both processing by software and processing by hardware. The memory 33A may be configured to store information regarding control and/or processing by the controller 33. The memory 33A may include at least one of a RAM, a ROM, and a flash memory. The programs 33B stored in the memory 33A may include one or more programs configured to, when executed by the CPU 33C, cause the CPU 33C to perform a below-mentioned heater control process.

The main heater 31 and the sub heater 32 are configured to generate heat when supplied with electricity from an AC power source 101. The sub heater 32 is electrically connected in parallel with the main heater 31. In the illustrative embodiment, power consumption of the main heater 31 is larger than power consumption of the sub heater 32. For instance, the AC/DC converter 34 may convert an AC voltage of 100 V into a DC voltage of 24 V, which is output to the DC/DC converter 35. The DC/DC converter 35 may convert the DC voltage of 24 V into a DC voltage of 3.3 V, which is supplied to the controller 33. The current sensor 37 is electrically connected in series with the main heater 31 and the sub heater 32. The current sensor 37 is configured to transmit a current value signal Sig1 to the controller 33. The current value signal Sig1 is a signal corresponding to a magnitude of an electric current flowing from the AC power source 101 to the main heater 31 and/or a magnitude of an electric current flowing from the AC power source 101 to the sub heater 32. Current consumption of the main heater 31 and the sub heater 32 is sufficiently larger than current consumption of the controller 33. Therefore, a current value to be detected by the controller 33 using the current sensor 37 may be regarded as a current value of an electric current flowing into the main heater 31 and/or the sub heater 32. Further, the current consumption in the controller 33 may be considered negligible. The current sensor includes a Hall element and an amplification circuit. The current sensor 37 is configured to produce a voltage by the Hall effect of the Hall element in response to a magnetic field generated in proportion to an electric current flowing through the Hall element, amplify the produced voltage via the amplification circuit, and output the amplified voltage to the controller 33. It is noted that, instead of the Hall element, a flux-gate type electromagnetic sensor may be used for the current sensor 37. In the following description, an electric current flowing into the main heater 31 and/or the sub heater 32, i.e., an electric current flowing through the current sensor 37 may be referred to as a "heater current." The relay 42 is configured to switch a state of electrical connection of the AC power source 101 with the main heater 31 and the sub heater 32 between a connected state and a disconnected state, in response to a relay control signal Sig2 output from the controller 33.

The zero-crossing detection circuit 36 is configured to, in response to detecting a zero-crossing timing of an AC power supplied from the AC power source 101, transmit a zero-crossing signal Sig3 to the controller 33. The zero-crossing signal Sig3 is a pulse signal. Specifically, the zero-crossing detection circuit 36 includes a diode bridge 51, a photo coupler PC21, resistors R21 and R22, and a transistor Tr1 that is an NPN bipolar transistor. The electric power supplied from the AC power source 101 is full-wave rectified by the diode bridge 51 and applied to an LED of the photo coupler PC21. A collector terminal of a photo transistor of the photo coupler PC21 is connected with a 24V DC power source via the resistor R21. An emitter terminal of the photo transistor of the photo coupler PC21 is grounded. A base terminal of the transistor Tr1 is connected with a connection point between the resistor R21 and the photo transistor of the photo coupler PC21. A collector terminal of the transistor Tr1 is connected with the controller 33. An emitter terminal of the transistor Tr1 is grounded. A wire for connecting the collector terminal of the transistor Tr1 with the controller 33 is pulled up to a power supply voltage inside the controller 33. The LED of the photo coupler PC21 is configured to emit light with a light emitting quantity depending on electric power supplied to the LED. Therefore, as a voltage applied to the LED of the photo coupler PC21 is reduced, an on-resistance of the photo transistor of the photo coupler PC21 increases, and a base voltage of the transistor Tr1 increases. Then, when the base voltage of the transistor Tr1 exceeds a threshold, the transistor Tr1 is switched on, and the zero-crossing signal Sig3 becomes a low-level signal. Accordingly, the zero-crossing signal Sig3 output from the zero-crossing detection circuit 36 is a pulse signal having a low-level value only for a particular period of time around the zero-crossing timing of the AC power supplied from the AC power source 101. The controller 33 identifies a zero-crossing timing of an AC current flowing between the AC power source 101 and the zero-crossing detection circuit 36, based on the zero-crossing signal Sig3.

The heater control circuit 43 includes a triac TA1, a photo triac coupler PC1, and resistors R1 and R2. The heater control circuit 44 includes a triac TA11, a photo triac coupler PC11, and resistors R11 and R12. A T2 terminal of the triac TA1 is connected with one of two electrodes of the AC power source 101. A T1 terminal of the triac TA1 is connected with the other of the two electrodes of the AC power source 101 via the main heater 31 and the relay 42. A gate terminal and the T1 terminal of the triac TA1 are connected with each other via the resistor R1. Further, the T2 terminal and the gate terminal of the triac TA1 are connected with each other via a triac of the photo triac coupler PC1 and the resistor R2. Into an anode terminal of an LED of the photo triac coupler PC1, a main-heater control signal Sig4 output from the controller 33 is input. A cathode terminal of the LED of the photo triac coupler PC1 is grounded. The controller 33 controls the main heater 31 with the main-heater control signal Sig4. The heater control circuit 44 is configured substantially in the same manner as the heater control circuit 43. Therefore, a detailed explanation of a configuration of the heater control circuit 44 will be omitted. Into an anode terminal of an LED of the photo triac coupler PC11 of the heater control circuit 44, a sub-heater control signal Sig5 output from the controller 33 is input. The controller 33 controls the sub heater 32 with the sub-heater control signal Sig5. Thus, the controller 33 may control the main heater 31 and the sub heater 32 independently.

To supply electricity to the main heater 31, the controller 33 switches the output level of the main-heater control signal Sig4 from a low level to a high level, and after a lapse of a particular period of time, switches the output level of the main-heater control signal Sig4 from the high level to the low level. Namely, the controller 33 transmits, to the heater control circuit 43, the main-heater control signal Sig4 that is a pulse signal having a particular pulse width. Thereby, the triac TA1 is turned on, and the main heater 31 is brought into an energized state. Then, at a zero-crossing timing, the triac TA1 is turned off, and the main heater 31 is brought into a non-energized state. In the following description, when the controller 33 brings the main heater 31 into the energized state by outputting the main-heater control signal Sig4 as a pulse signal, it may be referred to as "the controller 33 turns on the main heater 31." Likewise, when the controller 33 brings the sub heater 32 into the energized state by outputting the sub-heater control signal Sig5 as a pulse signal, it may be referred to as "the controller 33 turns on the sub heater 32."

Figure 3:
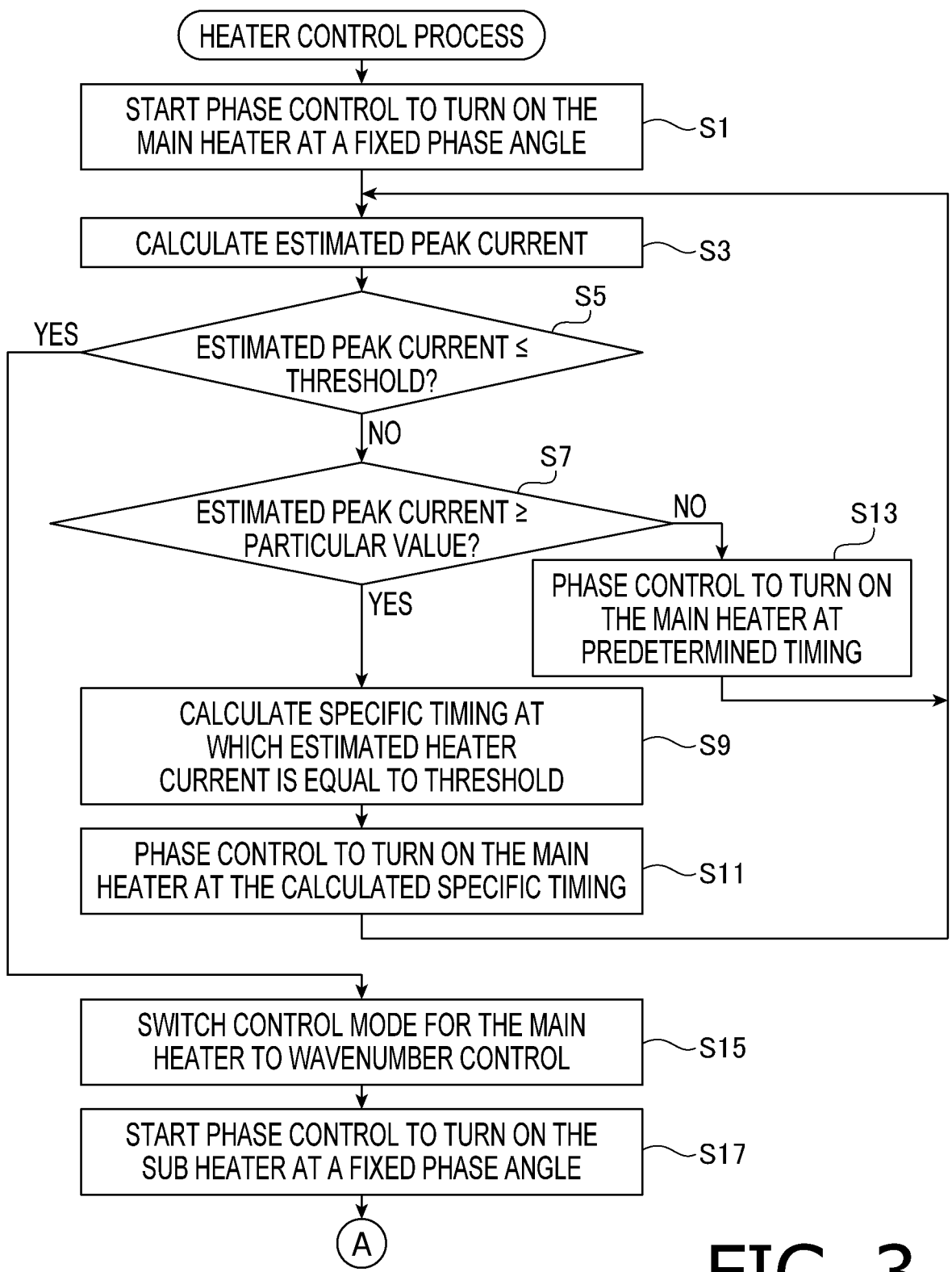
FIGS. 3 and 4 are flowcharts showing a procedure of a heater control process in the illustrative embodiment according to one or more aspects of the present disclosure.

For instance, when the printer 1 is powered on, the controller 33 launches a heater control process shown in FIG. 3. It is noted that, in response to the printer 1 being powered on, the controller 33 sets the level of the relay control signal Sig2 to a level for closing a contact point of the relay 42. The heater control process may be performed by the CPU 33C (see FIG. 2) executing one or more programs 33B stored in the memory 33A.

After launching the heater control process, the controller 33 first starts phase control of the main heater 31. In the phase control, in each half-cycle of the AC power supplied from the AC power source 101, the controller 33 controls the AC power source 101 to supply the electric power to the main heater 31 during a period of time between a specific timing after a lapse of a particular period of time from an earlier zero-crossing timing as a start of each half-cycle and a later zero-crossing timing as an end of each half-cycle. The specific timing corresponds to a specific phase angle of the AC power supplied from the AC power source 101. It is noted that in below-mentioned wavenumber control, the controller 33 controls the AC power source 101 to supply electricity to the main heater 31 for a half-cycle from an earlier zero-crossing timing as a start of the half-cycle to a later zero-crossing timing as an end of the half-cycle. The same applies to phase control and wavenumber control for the sub heater 32. It is noted that the controller 33 first starts control to turn on the main heater 31 without turning on the sub heater 32, and subsequently starts control to turn on the sub heater 32.

In most cases, each of the main heater 31 and the sub heater 32 has a low temperature and a low resistance immediately after the printer 1 is powered on. Hence, the controller 33 first performs the phase control for the main heater 31 before performing the wavenumber control therefor. Thereby, since a voltage to be applied to the main heater 31 is restricted, it is possible to prevent an excessive current (e.g., an inrush current) from flowing into the main heater 31. As the temperature of the main heater 31 increases after a lapse of a long period of time during which the controller 33 has continued to perform the phase control for the main heater 31, the resistance of the main heater 31 becomes higher. When determining that even if a maximum amplitude of voltage suppliable from the AC power source 101 is supplied to the main heater 31, an electric current flowing into the main heater 31 will not exceed a threshold, the controller 33 switches the control mode for the main heater 31 from the phase control to the wavenumber control. Further, the controller 33 starts control for turning on the sub heater 32. It is noted that, in the same manner as the controller 33 switches the control mode for the main heater 31, the controller 33 switches a control mode for the sub heater 32 from the phase control to the wavenumber control. As will be described below, the heater control process includes a process from starting the phase control for the main heater 31 (S1) to switching the control mode for the sub heater 32 to the wavenumber control (S33).

In a first half-cycle after the heater control process is started, the controller 33 turns on the main heater 31 at a fixed phase angle stored in the memory 33A (S1). Thereby, the main heater 31 is supplied with electricity from the AC power source 101 and generates heat. For instance, the fixed phase angle may be determined, through previous experiments, such that a heater current flowing into the main heater 31 does not exceed a threshold (e.g., 50 [A]) even when the main heater 31 is supplied with electricity under a worst condition (e.g., a condition that a maximum heater current flows into the main heater 31 as the main heater 31 has a minimum resistance value within a variable resistance range). Thus, since the main heater 31 is supplied with electricity at the fixed phase angle, it is possible to prevent an excessive current from flowing into the main heater 31. Subsequently, the controller 33 calculates an "estimated peak current" of the main heater 31, based on a current value of the heater current that is represented by the current value signal Sig1 at a detection timing in a period of time during which the main heater 31 is supplied with electricity (S3). The estimated peak current is a maximum value of the heater current in a half-cycle when it is assumed that the main heater 31 is under the wavenumber control by the controller 33. Specifically, the estimated peak current is a heater current at a phase angle of "π/2" and a heater current at a phase angle of "3π/2." In addition, a below-mentioned "peak current" is a maximum value of the heater current in a half-cycle when the main heater 31 is under the wavenumber control by the controller 33. It is noted that, in the following description, what is referred to merely as a "current value" may denote an absolute value of an electric current that is determined depending on a magnitude of the electric current, regardless of a direction of the electric current.

Figure 5:
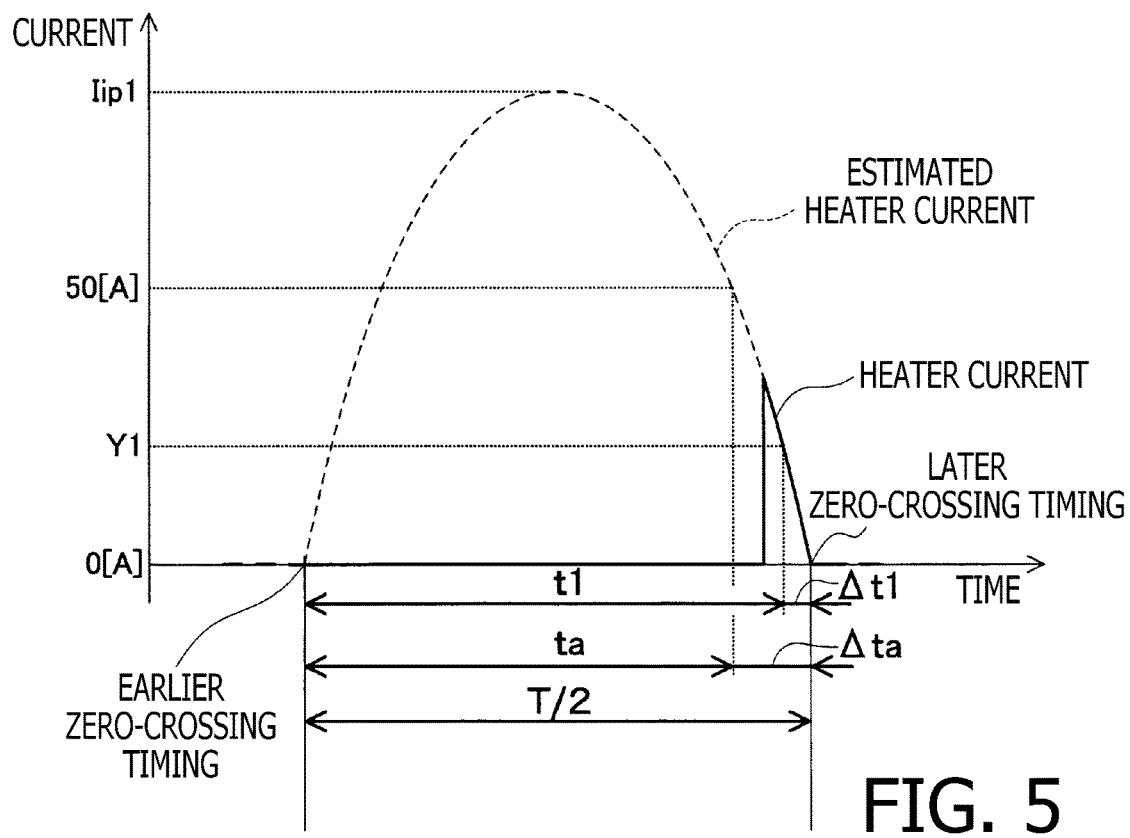
FIG. 5 is an illustration for explaining how to calculate an estimated peak current when only the main heater is supplied with electricity, in the illustrative embodiment according to one or more aspects of the present disclosure.

The step S3 will be described more specifically with reference to FIG. 5 having a horizontal axis as time and a vertical axis as a current value. In FIG. 5, a solid line indicates the heater current. Further, a dashed line indicates a heater current (hereinafter, which may be referred to as an "estimated heater current") estimated under an assumption that the main heater 31 is under the wavenumber control by the controller 33. When "Y1" represents a detected current value of the heater current represented by the current value signal Sig1, "T" represents a cycle of the AC power supplied from the AC power source 101, "Δt1" represents a period of time between a detection timing at which the current value Y1 is detected and the later zero-crossing timing immediately after the detection timing, and "Iip1" represents the estimated peak current, the detected current value Y1 is expressed by the following formula 1.

$$Y1 = Ipi1 \times \sin(2\pi \times \Delta t1/T) \quad \text{(Formula 1)}$$

The formula 1 may be deformed into the following formula 2.

$$Iip1 = Y1/\sin(2\pi \times \Delta t1/T) \quad \text{(Formula 2)}$$

When "θ" represents $(2\pi \times \Delta t1/T)$, sin θ may be approximated to θ in a case where θ is equal to or less than "$2\pi \times (35°/360°)$ [rad]." In this case, since there is no need for use of a trigonometric function, it is possible to reduce a calculation load. When the approximation of "sin θ" to "θ" is applied, the formula 2 may be expressed as the following formula 3.

$$Iip1 = Y1/(2\pi \times \Delta t1/T) \quad \text{(Formula 3)}$$

When "t1" represents a period of time between the earlier zero-crossing timing and the detection timing at which the current value Y1 is detected, Δt1 is expressed as "Δt1=T/2−t1." Therefore, the formula 3 is expressed as the following formula 4.

$$Iip1 = Y1/(\pi \times (1-2t1/T)) \quad \text{(Formula 4)}$$

Thus, in S3, the estimated peak current Iip1 is calculated by using the period of time t1, the detected current value Y1, the cycle T, and the formula 4.

Referring back to FIG. 3, subsequently, the controller 33 determines whether the estimated peak current Iip1 calculated in S3 is equal to or less than the threshold of 50 [A] (S5). In response to determining that the estimated peak current Iip1 is not equal to or less than the threshold (S5: No), the controller 33 determines whether the estimated peak current Iip1 is equal to or more than a particular value (S7). In response to determining that the estimated peak current Iip1 is equal to or more than the particular value (S7: Yes), the controller 33 calculates a specific timing at which the estimated heater current is equal to the threshold (S9).

The steps S7 and S9 will be described more specifically with reference to FIG. 5. When "Δta" represents a period of time between the specific timing at which the estimated heater current is equal to 50 [A] and the later zero-crossing timing immediately after the specific timing, the period of time Δta is determined as a solution of the following equation (i.e., the following formula 5).

$$50 = Iip1 \times \sin(2\pi \times \Delta ta/T) \quad \text{(Formula 5)}$$

When the aforementioned approximation of "sin θ" to "θ" is applied, the formula 5 may be deformed into the following formula 6.

$$\Delta ta = 50/Iip1/2\pi \times T \quad \text{(Formula 6)}$$

When "ta" represents a period of time between the earlier zero-crossing timing and the specific timing at which the estimated heater current is equal to 50 [A], the period of time Δta is expressed as follows.

$$\Delta ta = T/2 - ta$$

Further, when the formula 6 is deformed after the formula 4 is substituted thereinto, the period of time ta may be expressed as the following formula 7.

$$ta = T/2 - 50 \times (T - 2t1)/2Y1 \quad \text{(Formula 7)}$$

Thus, in S9, the controller 33 calculates the period of time ta, using the period of time t1 between the earlier zero-crossing timing and the detection timing, the detected current value Y1, the cycle T, and the formula 7. As mentioned above, however, when "θ" represents $(2\pi \times \Delta t1/T)$, sin θ may be approximated to θ only in a case where a requirement that θ is equal to or less than "$2\pi \times (35°/360°)$ [rad]" is satisfied. A condition satisfying the requirement is determined based on the following formula 8.

$$2\pi \times \Delta ta/T \leq 2\pi \times (35/360) \quad \text{(Formula 8)}$$

The formula 5 without the aforementioned approximation applied thereto may be deformed into the following formula 9.

$$2\pi \times \Delta ta/T = \arcsin(50/Iip1) \quad \text{(Formual 9)}$$

By substituting the formula 9 in the formula 8, the formula 8 may be deformed into the following formula 10.

$$Iip1 \geq 50/\sin(2\pi \times (35/360)) \quad \text{(Formula 10)}$$

The particular value in S7 is "$50/\sin(2\pi \times (35/360))$." Namely, in S7, the controller 33 determines whether it is possible to apply the aforementioned approximation of "sin θ" to "θ." Then, in response to determining that it is possible to apply the approximation, the controller 33 calculates, in S9, the specific timing at which the estimated heater current is equal to the threshold of 50 [A], using the formula 7.

Referring back to FIG. 3, after execution of S9, the controller 33 detects the earlier zero-crossing timing, and thereafter performs phase control to turn on the main heater 31 at the specific timing calculated in S9 (S11). Meanwhile, in response to determining that the estimated peak current Iip1 is not equal to or more than the particular value (S7: No), the controller 33 determines in S7 that it is not possible to apply the approximation, detects the earlier zero-crossing timing, and thereafter performs phase control to turn on the main heater 31 at a predetermined timing (S13). The predetermined timing is a timing at which "$2\pi \times \Delta ta/T$" is equal to "$2\pi \times (35°/360°)$." Namely, the predetermined timing is earlier than the later zero-crossing timing by the period of time $\Delta ta$ that satisfies the following formula 11.

$$(2\pi \times \Delta ta/T) = 2\pi \times (35/360) \qquad \text{(Formula 11)}$$

By using the period of time ta, the formula 11 may be expressed as the following formula 12.

$$ta = (1/2 - 35/360) \times T \qquad \text{(Formula 12)}$$

Figure 7:
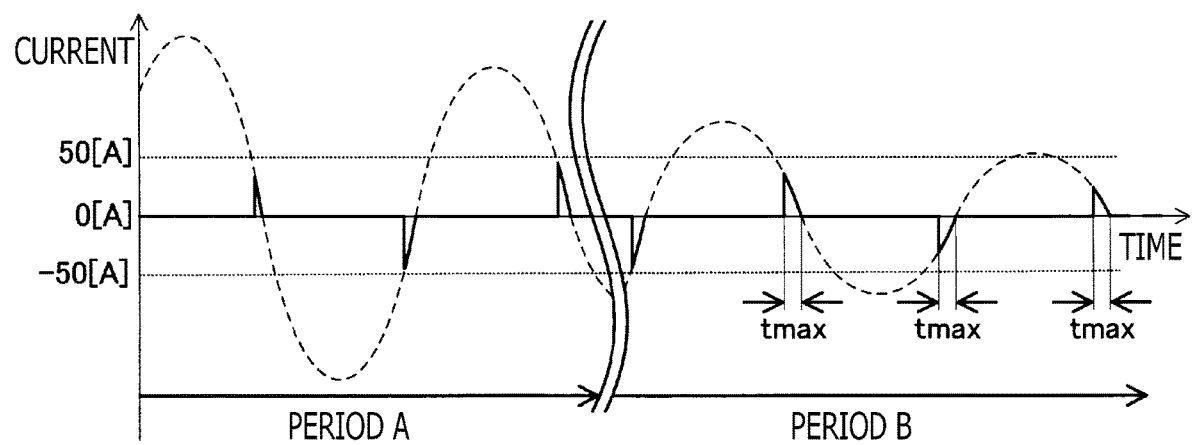
FIG. 7 is an illustration for explaining that an amplitude of an estimated heater current when only the main heater is supplied with electricity gradually decreases with the lapse of time, in the illustrative embodiment according to one or more aspects of the present disclosure.

After execution of S11 or S13, the controller 33 goes back to S3. It is noted that a process of S3 to S13 is performed once a half-cycle. As a temperature of the halogen heater of the main heater 31 increases, a resistance value of the halogen heater increases. Hence, although the controller 33 calculates in S9 the specific timing at which the estimated heater current is equal to the threshold, as shown in FIG. 7, in a next half-cycle, a maximum value of the heater current is less than the threshold. With the lapse of time to repeatedly execute the steps S3 to S11 in the phase control for the main heater 31, an amplitude of the estimated heater current gradually decreases. Accordingly, the specific timing to be calculated in S9 for a subsequent half-cycle becomes gradually earlier than the specific timing calculated in S9 for a precedent half-cycle, as shown in a period A in FIG. 7. Thus, as shown in the period A in FIG. 7, a period of time during which the main heater 31 is supplied with electricity in a subsequent half-cycle becomes gradually longer than a period of time during which the main heater 31 is supplied with electricity in a precedent half-cycle. Further, the estimated peak current Iip1 to be calculated in S3 for a subsequent half-cycle becomes gradually smaller than the estimated peak current Iip1 calculated in S3 for a precedent half-cycle. Then, in response to the estimated peak current Iip1 being less than the particular value (S7: No), the controller 33 performs phase control to turn on the main heater 31 at the predetermined timing (S13). Thus, in a period B shown in FIG. 7, after the estimated peak current Iip1 becomes less than the particular value (S7: No), the controller 33 continues to perform the phase control to turn on the main heater 31 at the predetermined timing in each half-cycle. It is noted that "tmax" in FIG. 7 is "$\Delta ta$" in the formula 11.

Referring back to FIG. 3, when the estimated peak current Iip1 is equal to or less than the threshold of 50 [A] (S5: Yes), the controller 33 switches the control mode for the main heater 31 from the phase control to the wavenumber control (S15). Specifically, the controller 33 switches the control mode for the main heater 31 to the wavenumber control to turn on the main heater 31 at the earlier zero-crossing timing in each half-cycle. Further, the controller 33 starts the phase control for the sub heater 32. In a first half-cycle after starting the phase control for the sub heater 32, the controller 33 turns on the sub heater 32 at a fixed phase angle stored in the memory 33A (S17). Thereby, the sub heater 32 is supplied with electricity from the AC power source 101. For instance, the fixed phase angle may be determined, through previous experiments, such that a combined current including an electric current flowing into the main heater 31 and an electric current flowing into the sub heater 32 does not exceed the threshold of 50 [A] even when the main heater 31 and the sub heater 32 are supplied with electricity under a worst condition. Thus, by beginning to supply electricity to the sub heater 32 in a period of time during which the phase angle is so small that the sub heater 32 may accept a further current flowing thereinto, it is possible to shorten a period of time required until the controller 33 switches the control mode for the sub heater 32 to the wavenumber control. Thereby, it is possible to shorten an FPOT ("FPOT" is an abbreviation of "First Print Out Time") in the printer 1. It is noted that the FPOT is a period of time required until the printer 1 outputs a first printed sheet from issuance of a print request.

Subsequently, the controller 33 calculates an estimated combined peak current (Iip1+Iip2), based on a current value of the heater current that is represented by the current value signal Sig1 at a detection timing after the sub heater 32 has begun to be supplied with electricity (S21). The estimated combined peak current (Iip1+Iip2) is a sum of the estimated peak current Iip1 of the main heater 31 and an estimated peak current Iip2 of the sub heater 32. Next, the controller 33 determines whether the estimated combined peak current (Iip1+Iip2) is equal to or less than the threshold of 50 [A] (S23).

Figure 6:
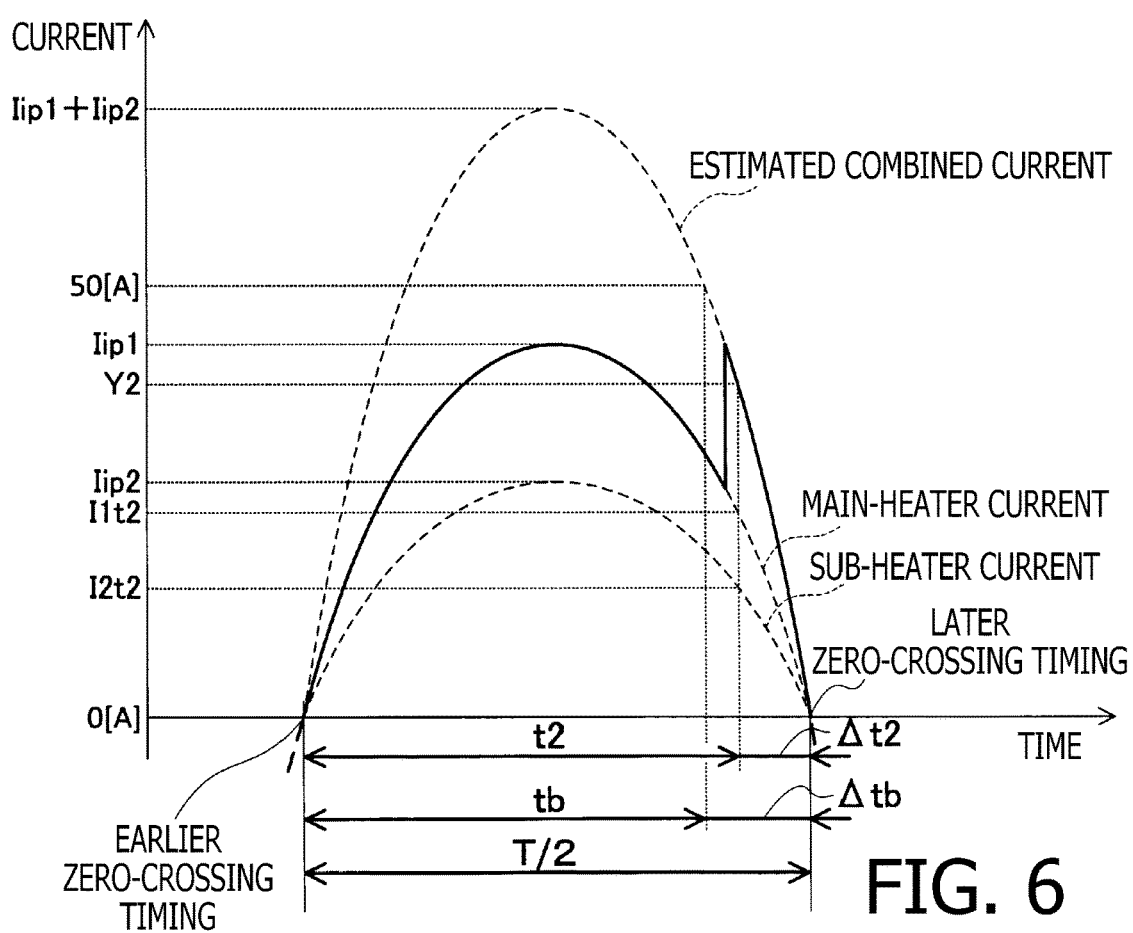
FIG. 6 is an illustration for explaining how to calculate an estimated combined peak current when the main heater and the sub heater are supplied with electricity, in the illustrative embodiment according to one or more aspects of the present disclosure.

The steps S21 to S23 will be described with reference to FIG. 6 having a horizontal axis as the time and a vertical axis as the current value. In FIG. 6, the combined current, including the electric current flowing into the main heater 31 and the electric current flowing into the sub heater 32, is indicated by a solid line. Further, an electric current (hereinafter referred to as a "main-heater current") flowing into the main heater 31 is indicated by a dashed line. A heater current (hereinafter referred to as a "sub-heater current") estimated to flow into the sub heater 32 when it is assumed that the sub heater 32 is under the wavenumber control by the controller 33 is indicated by a dashed line. Furthermore, a combined current (hereinafter referred to as an "estimated combined current") estimated to flow into the main heater 31 and the sub heater 32 when it is assumed that the sub heater 32 is under the wavenumber control by the controller 33 is indicated by a dashed line. It is noted that the heater current to be detected in S21 at the detection timing after the sub heater 32 has begun to be supplied with electricity is the combined current that includes the respective electric currents flowing into the main heater 31 and the sub heater 32.

In the following description, "Y2" represents a detected current value of the combined current, "T" represents the cycle of the AC power supplied from the AC power source 101, "t2" represents a period of time between the earlier zero-crossing timing and a detection timing at which the current value Y2 is detected, "$\Delta t2$" represents a period of time between the detection timing at which the current value Y2 is detected and the later zero-crossing timing immediately after the detection timing, "Iip1" represents the estimated peak current of the main heater 31, and "Iip2" represents the estimated peak current of the sub heater 32. Here, the detected current value Y2 is expressed by the following formula 13. During the half-cycle, an electric current flows into the main heater 31. Therefore, a peak current of the main heater 31 may be detected. However, in the illustrative embodiment, the peak current of the main heater 31 is not detected. Hence, the following description will be provided using the estimated peak current Iip1.

$$Y2 = (Ipi1 + Ipi2) \times \sin(2\pi \times \Delta t2/T) \qquad \text{(Formula 13)}$$

When "$\theta$" represents $(2\pi \times \Delta t2/T)$, $\sin \theta$ may be approximated to $\theta$ in a case where $\theta$ is equal to or less than "$2\pi \times (35°/360°)$ [rad]." In this case, the formula 13 may be deformed into the following formula 14.

$$Iip1 + Iip2 = Y2/(2\pi \times \Delta t2/T) \qquad \text{(Formula 14)}$$

By using the period of time t2, the period of time Δt2 is expressed by the following formula 15.

$$\Delta t2 = T/2 - t2 \quad \text{(Formula 15)}$$

By substituting the formula 15 in the formula 14, the formula 14 may be deformed into the following formula 16.

$$Iip1 + Iip2 = Y2/(\pi \times (1 - 2t2/T)) \quad \text{(Formula 16)}$$

In S23, the controller 33 determines whether the estimated combined peak current (Iip1+Iip2) calculated in S21 using the formula 16 is equal to or less than the threshold.

Figure 4:
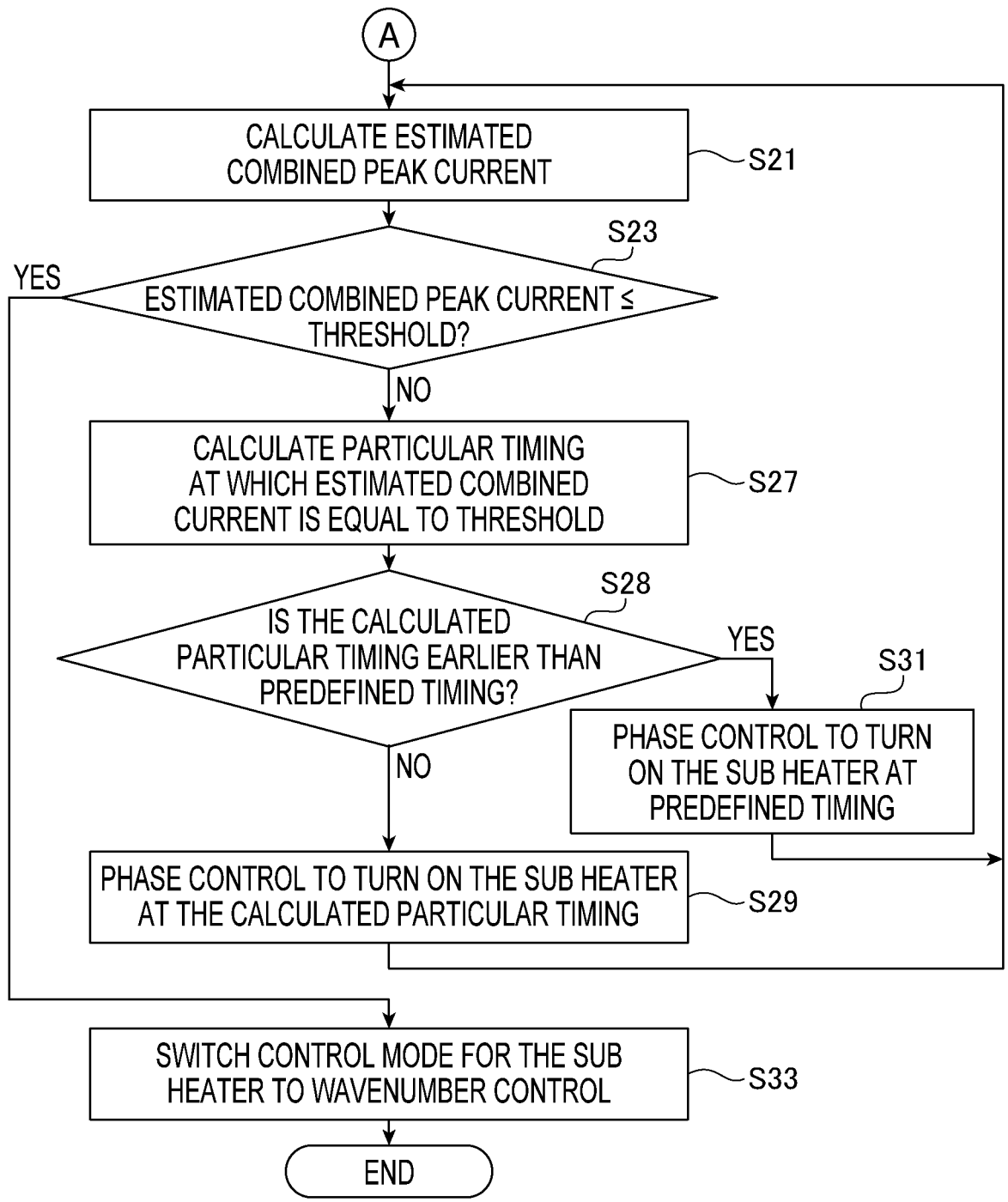

Referring back to FIG. 4, in response to determining that the estimated combined peak current (Iip1+Iip2) is not equal to or less than the threshold (S23: No), the controller 33 calculates a particular timing at which the estimated combined current is equal to the threshold (S27). Next, the controller 33 determines whether the particular timing calculated in S27 is earlier than a predefined timing (S28). In response to determining that the particular timing is not earlier than the predefined timing (S28: No), the controller 33 performs phase control to turn on the sub heater 32 at the particular timing calculated in S27 (S29). Meanwhile, in response to determining that the particular timing is earlier than the predefined timing (S28: Yes), the controller 33 performs phase control to turn on the sub heater 32 at the predefined timing (S31).

The steps S27 to S31 will be described with reference to FIG. 6. In FIG. 6, "I1t2" represents a current value of the electric current flowing into the main heater 31 at the detection timing at which the combined current is detected in S21. Further, "I2t2" represents a current value of the electric current flowing into the sub heater 32 at the detection timing at which the combined current is detected in S21. When "Δtb" represents a period of time between the particular timing at which the estimated combined current is equal to the threshold of 50 [A] and the later zero-crossing timing immediately after the particular timing, the period of time Δtb is determined as a solution of the following equation (i.e., the following formula 17).

$$50 = (Iip1 + Iip2) \times \sin(2\pi \times \Delta tb/T) \quad \text{(Formula 17)}$$

When "θ" represents (2π×Δtb/T), sin θ may be approximated to θ in a case where θ is equal to or less than "2π×(35°/360°) [rad]." In this case, the period of time Δtb may be expressed by the following formula 18.

$$\Delta tb = 50/(Iip1 + Iip2)/2\pi \times T \quad \text{(Formula 18)}$$

By substituting the formula 14 in the formula 18, the formula 18 may be deformed into the following formula 19.

$$\Delta tb + 50 \times \Delta t2/Y2 \quad \text{(Formula 19)}$$

When "tb" represents a period of time between the earlier zero-crossing timing and the particular timing at which the estimated combined current is equal to the threshold, the period of time Δtb is expressed by the following formula 20.

$$\Delta tb = T/2 - tb \quad \text{(Formula 20)}$$

By substituting the formula 20 and the formula 15 in the formula 19, the formula 19 may be deformed into the following formula 21.

$$tb = T/2 - 50(T - 2t2)/2Y2 \quad \text{(Formula 21)}$$

In S27, the controller 33 calculates the period of time tb by using the detected current value Y2, the cycle T, the period of time t2, and the formula 21.

When the following formula 22 is satisfied, the aforementioned approximation of "sin θ" to "θ" may be applied.

$$2\pi \times \Delta tb/T \leq 2\pi \times (35/360) \quad \text{(Formula 22)}$$

The formula 22 may be deformed into the following formula 23.

$$\Delta tb \leq (35/360) \times T \quad \text{(Formula 23)}$$

By substituting the formula 20 in the formula 23, the formula 23 may be deformed into the following formula 24.

$$tb \leq (1/2 - 35/360) \times T \quad \text{(Formula 24)}$$

Namely, the approximation may be applied when the period of time tb is equal to or more than "(1/2−35/360)×T." In S28, the controller 33 determines whether it is possible to apply the approximation, by comparing the period of time tb calculated in S27 with the value "(1/2−35/360)×T." When the period of time tb calculated in S27 is equal to or more than "(1/2−35/360)×T," i.e., when the particular timing after a lapse of the period of time tb from the earlier zero-crossing timing is equal to or later than the predefined timing after a lapse of "(1/2−35/360)×T" from the earlier zero-crossing timing (S28: No), the controller 33 determines that it is possible to apply the approximation, and turns on the sub heater 32 at the particular timing when the period of time tb has elapsed since the earlier zero-crossing timing. Meanwhile, when the particular timing after a lapse of the period of time tb from the earlier zero-crossing timing is earlier than the predefined timing after a lapse of "(1/2−35/360)×T" from the earlier zero-crossing timing (S28: Yes), the controller 33 determines that it is not possible to apply the approximation, and turns on the sub heater 32 at the predefined timing when a period of time "(1/2−35/360)×T" has elapsed since the earlier zero-crossing timing.

Referring back to FIG. 4, when determining that the particular timing is not earlier than the predefined timing (S28: No), the controller 33 detects the earlier zero-crossing timing, and thereafter performs the phase control to turn on the sub heater 32 at the calculated particular timing (S29). Meanwhile, when determining that the particular timing is earlier than the predefined timing (S28: Yes), the controller 33 detects the earlier zero-crossing timing, and thereafter performs the phase control to turn on the sub heater 32 at the predefined timing (S31). It is noted that the predefined timing is a timing at which "2π×Δtb/T" is equal to "2π× (35°/360°) ." Namely, the predefined timing is later than the earlier zero-crossing timing by the period of time tb determined from the following formula 25.

$$tb = (1/2 - 35/360) \times T \quad \text{(Formula 25)}$$

Figure 8:
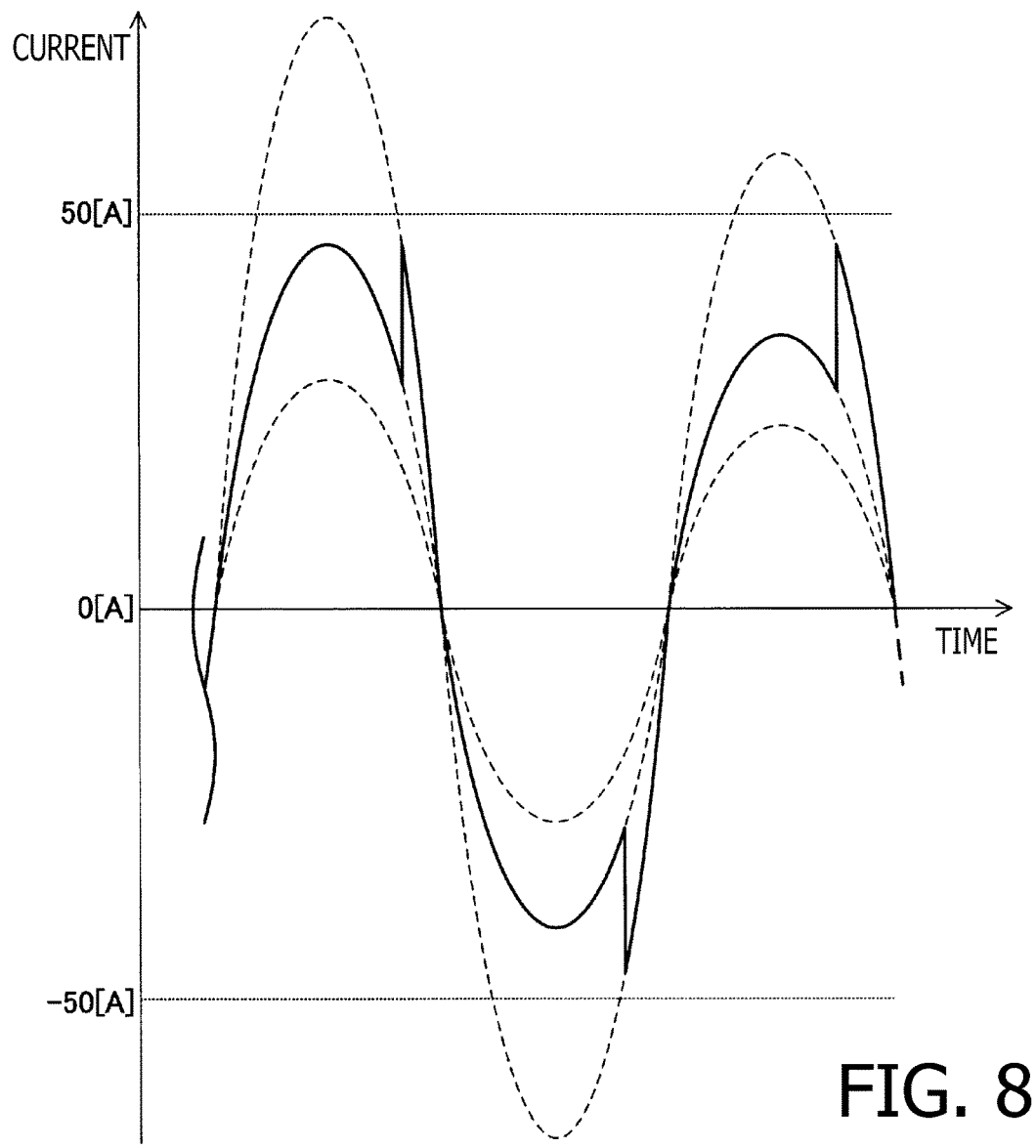
FIG. 8 is an illustration for explaining that an amplitude of an estimated combined current when the main heater and the sub heater are supplied with electricity gradually decreases with the lapse of time, in the illustrative embodiment according to one or more aspects of the present disclosure.

After execution of S29 or S31, the controller 33 goes back to S21. It is noted that a process of S21 to S31 is performed once a half-cycle. In the same manner as when the controller 33 performs the phase control for the main heater 31, in S27, the controller 33 calculates the particular timing at which the estimated combined current is equal to the threshold. Nonetheless, since the resistance value of each of the heaters 31 and 32 gradually increases with an increase in temperature of each heater, as shown in FIG. 8, in a next half-cycle, a maximum value of the combined current at the particular timing when the sub heater 32 is turned on is less than the threshold. With the lapse of time to repeatedly execute the steps S21 to S31 in the phase control of the sub heater 32, an amplitude of the estimated combined current gradually decrease. Accordingly, the particular timing to be calculated in S27 for a subsequent half-cycle becomes gradually earlier than the particular timing calculated in S27 for a precedent half-cycle, as shown in FIG. 8. Thus, as shown in FIG. 8, a period of time during which the sub heater 32 is supplied with electricity in a subsequent half-cycle becomes gradually longer than a period of time during which the sub heater 32 is supplied with electricity in a precedent half-cycle. Then, in response to a further decrease in the estimated peak current, when determining that the particular timing calculated in S27 is earlier than the predefined timing, the controller 33 performs the phase control to turn on the sub heater 32 at the predefined timing in S31.

Referring back to FIG. 4, in response to determining that the estimated combined peak current (Iip1+Iip2) is equal to or less than the threshold of 50 [A] (S23: Yes), the controller 33 switches the control mode for the sub heater 32 from the phase control to the wavenumber control (S33). Specifically, the controller 33 switches to the wavenumber control to turn on the sub heater 32 at the earlier zero-crossing timing in S33. Thereby, the main heater 31 and the sub heater 32 are under the wavenumber control by the controller 33. After execution of S33, the controller 33 terminates the heater control process. After completion of the heater control process, the controller 33 begins to control the main heater 31 and the sub heater 32 such that the temperatures of the main heater 31 and the sub heater 32 become target temperatures.

The aforementioned illustrative embodiment provides the following advantageous effects. In S21, the controller 33 calculates the estimated combined peak current (Iip+Iip2), based on the current value of the heater current that is represented by the current value signal Sig1 at the detection timing after the sub heater 32 has begun to be supplied with electricity. The estimated combined peak current (Iip1+Iip2) is a sum of the estimated peak current Iip1 of the main heater 31 and the estimated peak current Iip2 of the sub heater 32 when it is assumed that the sub heater 32 begins to be supplied with electricity while the main heater 31 is being supplied with electricity. Further, in S29, the controller 33 turns on the sub heater 32 at the particular timing calculated in S27 as a timing at which the estimated combined current is equal to the threshold. Further, in response to determining that the estimated combined peak current (Iip1+Iip2) is equal to or less than the threshold of 50 [A] (S23: Yes), the controller 33 switches to the wavenumber control to turn on the sub heater 32 at the earlier zero-crossing timing. Thereby, even in a state where the estimated combined peak current is not equal to or less than the threshold when it is assumed that the main heater 31 and the sub heater 32 are under the wavenumber control, the controller 33 may perform the phase control for the sub heater 32 in such a manner that the AC current to flow into the main heater 31 and the sub heater 32 is equal to or less than the threshold. Thus, it is possible to shorten the FPOT while restricting the electric power to be supplied to the main heater 31 and the sub heater 32.

Further, in S23, the controller 33 determines whether the estimated combined peak current (Iip1+Iip2) is equal to or less than the threshold of 50 [A], using the formula 16. Thus, by using the formula 16, it is possible to determine whether the estimated combined peak current (Iip1+Iip2) is equal to or less than the threshold of 50 [A].

Further, in S3, the controller 33 calculates the estimated peak current Iip1 to flow into the main heater 31, based on the current value of the heater current that is represented by the current value signal Sig1 at the detection timing in the period of time during which the main heater 31 is supplied with electricity. Further, in response to determining that the estimated peak current Iip1 is equal to or less than the threshold of 50 [A] (S5: Yes), the controller 33 switches the control mode for the main heater 31 from the phase control to the wavenumber control (S15). Thereby, when it is assumed that the main heater 31 is under the wavenumber control, it is possible to secure the peak current of the main heater 31 that is equal to or less than the threshold. Thus, it is possible to prevent the electric current flowing into the main heater 31 from exceeding the threshold, while making the FPOT shorter than when the control mode for the main heater 31 is switched to the wavenumber control after a lapse of a predetermined period of time.

Further, in response to determining that the estimated combined peak current (Iip1+Iip2) is not equal to or less than the threshold of 50 [A] (S23: No), the controller 33 calculates the particular timing at which the estimated combined current is equal to the threshold (S27), and in the next half-cycle, performs the phase control to turn on the sub heater 32 at the calculated particular timing (S29). Thereby, the controller 33 may turn on the sub heater 32 in such a manner that the heater current does not exceed the threshold.

The particular timing calculated in S27 is such a timing that the period of time tb from the earlier zero-crossing timing thereto is shorter than a period of time between a corresponding earlier zero-crossing timing and the timing at which the controller 33 turned on the sub heater 32 in the half-cycle during which the controller 33 detected the current value of the heater current to be used for calculation of the estimated combined peak current (Iip1+Iip2). Thereby, even though the estimated combined peak current (Iip1+Iip2) is more than the threshold, it is possible to make the FPOT shorter than when the controller 33 turns on the sub heater 32 at the same timing as the timing at which the controller 33 turned on the sub heater 32 in the half-cycle during which the controller 33 detected the current value of the heater current to be used for calculation of the estimated combined peak current (Iip1+Iip2).

Further, in S27, the controller 33 calculates the particular timing at which the estimated combined current is equal to the threshold, using the formula 21. Thus, by using the formula 21, it is possible to calculate the particular timing at which the estimated combined current is equal to the threshold.

Further, in response to determining that the particular timing calculated in S27 is earlier than the predefined timing (S28: Yes), i.e., when the period of time tb between the earlier zero-crossing timing and the particular timing calculated in S27 is less than "$(1/2-35/360)\times T$," the controller 33 turns on the sub heater 32 at the predefined timing when the period of time tb determined from the formula 25 has elapsed since the earlier zero-crossing timing (S31). When "$\theta$" represents $(2\pi\times\Delta tb/T)$, as "$\theta$" approaches "$\pi/2$," the accuracy of the approximation of "$\sin\theta$" to "$\theta$" is lowered. Therefore, when $\theta$ is more than "$2\pi\times(35°/360°)$ [rad]," the controller 33 turns on the sub heater 32 at the predefined timing when the period of time tb determined from the formula 25 has elapsed since the earlier zero-crossing timing. Thus, it is possible to calculate the particular timing at which the estimated combined current is equal to the threshold, by using the formula 21 within such a phase range as to secure highly accurate approximation of "$\sin\theta$" to "$\theta$."

Further, the power consumption of the sub heater 32 is smaller than the power consumption of the main heater 31. Hence, a heater current when only the sub heater 32 is supplied with electricity is smaller than a heater current when only the main heater 31 is supplied with electricity. Therefore, even in a state where the heater current when only the main heater 31 is supplied with electricity reaches the threshold, it is possible to supply electricity to the sub heater 32 within such a phase range as to keep the combined current less than the threshold.

<Second Example>

Subsequently, another example (hereinafter referred to as a "second example") of the steps S21 to S27 will be described. In the aforementioned example (hereinafter referred to as the "first example") of the steps S21 to S27, the controller 33 calculates the particular timing at which the estimated combined current is equal to the threshold, based on a current value of the heater current that is represented by the current value signal Sig1 at a timing after the sub heater 32 has begun to be supplied with electricity. In the second example, the controller 33 may calculate a particular timing at which the estimated combined current is equal to the threshold, based on a current value of the heater current that is represented by the current value signal Sig1 at a timing after the sub heater 32 has begun to be supplied with electricity and current values of the heater current that are represented by the current value signal Sig1 at timings at which only the main heater 31 is supplied with electricity.

Figure 9:
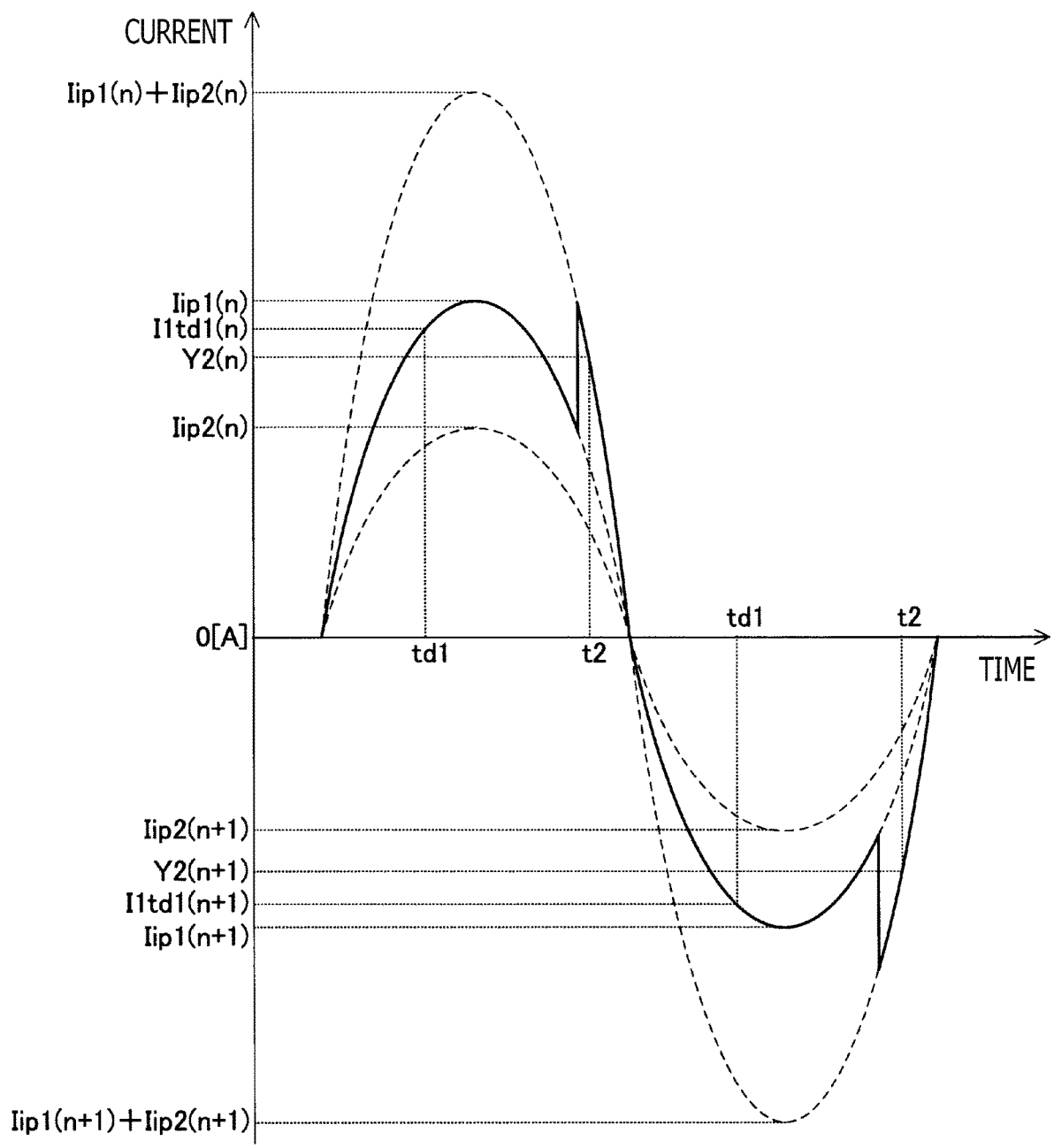
FIG. 9 is an illustration for explaining how to calculate a timing to start supplying electricity to the sub heater while the main heater is supplied with electricity, in another example of the illustrative embodiment according to one or more aspects of the present disclosure.

The second example will be described with reference to FIG. 9. In the same manner as shown in FIG. 6, in FIG. 9, the combined current, including the electric current flowing into the main heater 31 and the electric current flowing into the sub heater 32, is indicated by a solid line. A main-heater current flowing into the main heater 31 is indicated by a dashed line. A sub-heater current estimated to flow into the sub heater 32 when it is assumed that the sub heater 32 is under the wavenumber control by the controller 33 is indicated by a dashed line. Furthermore, an estimated combined current estimated to flow into the main heater 31 and the sub heater 32 when it is assumed that the sub heater 32 is under the wavenumber control by the controller 33 is indicated by a dashed line. In the following description, "T" represents the cycle of the AC power supplied from the AC power source 101, "Y2($n$)" represents a detected current value of the combined current in an n-th half-cycle, "t2" represents a period of time between the earlier zero-crossing timing and a detection timing at which the current value Y2($n$) is detected, "Iip1($n$)" represents the estimated peak current of the main heater 31 in the n-th half-cycle, and "Iip2($n$)" represents the estimated peak current of the sub heater 32 in the n-th half-cycle. Further, "I1td1($n$)" represents a detected current value of the heater current in a state where only the main heater 31 is supplied with electricity in the n-th half-cycle, and "td1" represents a period of time between the earlier zero-crossing timing and a detection timing at which the current value I1td1($n$) is detected. Likewise, "Y2($n$+1)" represents a detected current value of the combined current in an (n+1)-th half-cycle, "Iip1($n$+1)" represents the estimated peak current of the main heater 31 in the (n+1)-th half-cycle, and "Iip2($n$+1)" represents the estimated peak current of the sub heater 32 in the (n+1)-th half-cycle. Further, "I1td1(n+1)" represents a detected current value of the heater current in a state where only the main heater 31 is supplied with electricity at a detection timing when the period of time td1 has elapsed since the earlier zero-crossing timing in the (n+1)-th half-cycle.

In the same manner as the formula 16 is derived, the estimated combined peak current (Iip1($n$)+Iip2($n$)) in the n-th half-cycle is expressed by the following formula 26.

$$Iip1(n)+Iip2(n)=Y2(n)/(\pi \times (1-2t2/T)) \quad \text{(Formula 26)}$$

Further, the estimated peak current Iip1($n$) of the main heater 31 in the n-th half-cycle is expressed by the following formula 27.

$$Iip1(n)=I1td1(n)/(\pi \times (1-2td1/T)) \quad \text{(Formula 27)}$$

Further, the estimated peak current Iip1($n$+1) of the main heater 31 in the (n+1)-th half-cycle is expressed by the following formula 28.

$$Iip1(n+1)=I1td1(n+1)/(\pi \times (1-2td1/T)) \quad \text{(Formula 28)}$$

Using the formulas 26 to 28, "Iip1($n$+1)+Iip2($n$)" is expressed by the following formula 29.

$$Iip1(n+1)+Iip2(n)=Iip1(n+1)+Iip1(n)+Iip2(n)-Iip1(n)=T/\pi \times (Y2(n)/T-2t2)-(I1td1(n)-I1td1(n+1))/(T-2td1)) \quad \text{(Formula 29)}$$

When "tc(n+1)" represents a period of time between the earlier zero-crossing timing and a particular timing at which the estimated combined current is equal to 50 [A] in the (n+1)-th half-cycle, the period of time tc(n+1) is determined as a solution of the following equation (i.e., the following formula 30).

$$50=(Iip1(n+1)+Iip2(n))\times \pi \times (1-2tc(n+1)/T) \quad \text{(Formula 30)}$$

By substituting the formula 29 in the formula 30, the formula 30 may be deformed into the following formula 31.

$$tc(n+1)=1/2\times (T-50\times (T-2td1)(T-2t2/(Y2(n)\times (T-2td1)-(I1td1(n)-I1td1(n+1))\times (T-2t2)))) \quad \text{(Formula 31)}$$

In the second example, in S21, the controller 33 detects the current value I1td1($n$), the current value Y2($n$), and the current value I1td1($n$+1). It is noted that the detected current value I1td1($n$) is a current value of the heater current in a state where only the main heater 31 is supplied with electricity at a timing when the period of time td1 has elapsed since the earlier zero-crossing timing in the n-th half-cycle. In addition, the detected current value Y2($n$) is a current value of the heater current at a timing when the period of time t2 has elapsed since the earlier zero-crossing timing in the n-th half-cycle. Further, the detected current value I1td1($n$+1) is a current value of the heater current in a state only the main heater 31 supplied with electricity at a timing when the period of time td1 has elapsed since the earlier zero-crossing timing in the (n+1)-th half-cycle. Furthermore, in S27, the controller 33 calculates the period of time tc(n+1) from the formula 31. Then, the controller 33 turns on the sub heater 32 at a particular timing when the calculated period of time tc(n+1) has elapsed since the earlier zero-crossing timing. Thereby, the second example may reflect, more than the aforementioned first example, a difference between an electric current flowing into the main heater 31 in the n-th half-cycle and a relatively smaller electric current flowing into the main heater 31 in the (n+1)-th half-cycle. Therefore, in the second example, the controller 33 may turn on the sub heater 32 at an earlier timing than in the aforementioned first example.

The aforementioned second example provides the following advantageous effects. The controller 33 calculates the period of time tc(n+1) between the earlier zero-crossing timing and the particular timing at which the estimated combined current is equal to 50 [A] in the (n+1)-th half-cycle, based on the detected current value Y2($n$), the period of time t2, the detected current value I1td1($n$), the period of time td1, the detected current value Itd1($n$+1), and the formula 31. It is noted that the detected current value Y2($n$) is a current value of the combined current in the n-th half-cycle. In addition, the period of time t2 is a period of time between the earlier zero-crossing timing and the detection timing at which the current value Y2($n$) is detected. Further, the detected current value I1td1($n$) is a current value of the heater current in a state where only the main heater 31 is supplied with electricity in the n-th half-cycle. Further, the period of time td1 is a period of time between the earlier zero-crossing timing and the detection timing at which the current value I1td1(n) is detected in the n-th half-cycle. Furthermore, the detected current value I1td1(n+1) is a current value of the heater current in a state where only the main heater 31 is supplied with electricity at a timing when the period of time td1 has elapsed since the earlier zero-crossing timing in the (n+1)-th half-cycle. Thereby, the second example may reflect the difference between an electric current flowing into the main heater 31 in the n-th half-cycle and a relatively smaller electric current flowing into the main heater 31 in the (n+1)-th half-cycle, more than when a particular timing to turn on the sub heater 32 is calculated without use of any current values of the heater current in a state where only the main heater 31 is supplied with electricity. Thus, the controller 33 may turn on the sub heater 32 at the particular timing that is earlier than a particular timing calculated without use of any current values of the heater current in a state where only the main heater 31 is supplied with electricity.

Hereinabove, the illustrative embodiment according to aspects of the present disclosure has been described. The present disclosure can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present disclosure. However, it should be recognized that the present disclosure can be practiced without reapportioning to the details specifically set forth. In other instances, well known processing structures have not been described in detail, in order not to unnecessarily obscure the present disclosure.

Only an exemplary illustrative embodiment of the present disclosure and but a few examples of their versatility are shown and described in the present disclosure. It is to be understood that the present disclosure is capable of use in various other combinations and environments and is capable of changes or modifications within the scope of the inventive concept as expressed herein. For instance, according to aspects of the present disclosure, the following modifications are possible.

<Modifications>

In the aforementioned illustrative embodiment, the heater control circuits 43 and 44 include the triac TA1 and the triac TA11, respectively. However, each of the heater control circuits 43 and 44 may include a semiconductor device such as a field-effect transistor, instead of the triac TA1 and the triac TA11.

In the aforementioned illustrative embodiment, the heating device 30 includes the current sensor 37 placed on an electric path leading from the AC power source 101 to the AC/DC converter 34. Nonetheless, for instance, the current sensor 37 may be placed on an electric path leading to the relay 42 after branching off from the electric path leading from the AC power source 101 to the AC/DC converter 34. Further, for instance, the heating device 30 may include a first current sensor placed on an electric path leading to the main heater 31 after branching off from an electric path leading from the relay 42 to the main heater 31 and the sub heater 32, and a second current sensor placed on an electric path leading to the sub heater 32 after branching off from the electric path leading from the relay 42 to the main heater 31 and the sub heater 32.

In the aforementioned second example, the controller 33 calculates, from the formula 31, the period of time tc(n+1) between the earlier zero-crossing timing and the particular timing at which the estimated combined current is equal to 50 [A] in the (n+1)-th half-cycle. Nonetheless, for instance, the controller 33 may calculate a reduction current difference by subtracting the detected current value I1td1(n+1) from the detected current value I1td1(n) and calculate a period of time corresponding to the calculated reduction current difference. In this case, the controller 33 may determine, as the period of time tc(n+1), a period of time shorter by the calculated period of time than the period of time between the earlier zero-crossing timing and the particular timing at which the estimated combined current is equal to 50 [A] in the n-th half-cycle. Further, for instance, the controller 33 may calculate a reduction current difference by subtracting the estimated peak current Iip2(n+1) from the estimated peak current Iip2(n) and calculate a period of time corresponding to the calculated reduction current difference. In this case, the controller 33 may determine, as the period of time tc(n+1), a period of time shorter by the calculated period of time than the period of time between the earlier zero-crossing timing and the particular timing at which the estimated combined current is equal to 50 [A] in the n-th half-cycle.

In the aforementioned illustrative embodiment, the power consumption of the main heater 31 is larger than power consumption of the sub heater 32. Nonetheless, the power consumption of the main heater 31 may not necessarily be larger than the power consumption of the sub heater 32. Aspects of the present disclosure may be applied to an image forming apparatus including two heaters.

In the aforementioned illustrative embodiment, aspects of the present disclosure are applied to the printer 1 that is a monochrome laser printer. Nonetheless, aspects of the present disclosure may be applied to other image forming apparatuses such as a color laser printer, a printer configured to form an electrostatic latent image on a surface of a photoconductive drum by exposing the charged surface of the photoconductive drum to laser light from an LED, and a multi-function peripheral having a plurality of functions such as a printing function and a copy function.

Associations between elements exemplified in the aforementioned illustrative embodiment and elements according to aspects of the present disclosure will be exemplified below. The printer 1 may be an example of an "image forming apparatus" according to aspects of the present disclosure. The main heater 31 may be an example of a "first heater" according to aspects of the present disclosure. The sub heater 32 may be an example of a "second heater" according to aspects of the present disclosure. The current sensor 37 may be an example of a "current sensor" according to aspects of the present disclosure. The controller 33 may be an example of a "controller" according to aspects of the present disclosure. In this case, the CPU 33C and the memory 33A storing the programs 33B may be included in the "controller" according to aspects of the present disclosure. Each of the respective timings at which the sub heater 32 is turned on in S17, S29, and S31 in a previous half-cycle may be an example of a "first particular timing" in a "first half-cycle" according to aspects of the present disclosure. The particular timing at which the sub heater 32 is turned on in S29 in a next half-cycle may be an example of a "second particular timing" in a "second half-cycle" according to aspects of the present disclosure. The predefined timing at which the sub heater 32 is turned on in S31 in the next half-cycle may be an example of a "predefined timing" in the "second half-cycle" according to aspects of the present disclosure. The detection timing at which the heater current (i.e., the combined current) is detected in S21 may be an example of a "first detection timing" in the "first half-cycle" according to aspects of the present disclosure. Each of the respective timings at which the main heater 31 is turned on in S1, S11, and S13 in a precedent half-cycle may be an example of a "first specific timing" in a "third half-cycle" according to aspects of the present disclosure. The specific timing at which the main heater 31 is turned on in S11 in a subsequent half-cycle may be an example of a "second specific timing" in a "fourth half-cycle" according to aspects of the present disclosure. The detection timing at which the heater current is detected in S3 may be an example of a "second detection timing" in the "third half-cycle" according to aspects of the present disclosure. The detection timing at which the current value I1td1(n) (see FIG. 9) is detected in the n-th half-cycle may be an example of a "first sensing timing" in the "first half-cycle" according to aspects of the present disclosure. The detection timing at which the current value I1td1(n+1) (see FIG. 9) is detected in the (n+1)-th half-cycle may be an example of a "second sensing timing" in the "second half-cycle" according to aspects of the present disclosure.

What is claimed is:

1. An image forming apparatus comprising:
a first heater;
a second heater electrically connected in parallel with the first heater;
a current sensor electrically connected in series with the first heater and the second heater; and
a controller configured to:
  begin to supply AC power from an AC power source to the first heater at a start of a first half-cycle of the AC power, thereby causing an alternating current, of which an absolute value is equal to or less than a threshold from the start until an end of the first half-cycle, to flow into the first heater;
  begin to supply the AC power to the second heater at a first particular timing after beginning to supply the AC power to the first heater, in the first half-cycle, the first particular timing being a timing from which a combined current is equal to or less than the threshold until the end of the first half-cycle, the combined current being a sum of absolute values of respective alternating currents flowing into the first heater and the second heater;
  calculate an estimated combined peak current, based on a signal output from the current sensor at a first detection timing later than the first particular timing in the first half-cycle and the first detection timing, the estimated combined peak current being a maximum value of an estimated combined current, the estimated combined current being a sum of absolute values of respective alternating currents estimated to flow into the first heater and the second heater when it is assumed that the first heater and the second heater are supplied with the AC power from the start until the end of the first half-cycle;
  determine whether the estimated combined peak current is equal to or less than the threshold;
  in response to determining that the estimated combined peak current is more than the threshold, begin to supply the AC power to the second heater at a second particular timing in a second half-cycle next to the first half-cycle, the second particular timing satisfying that a period of time between a start of the second half-cycle and the second particular timing is equal to a period of time between the start of the first half-cycle and a timing from which the estimated combined current is equal to or less than the threshold until the end of the first half-cycle; and
  in response to determining that the estimated combined peak current is equal to or less than the threshold, begin to supply the AC power to the second heater at the start of the second half-cycle.

2. The image forming apparatus according to claim 1, wherein the controller is further configured to determine whether the estimated combined peak current is equal to or less than the threshold, using a formula "Ic/(π×(1−2td/T))≤A" where "T" represents a cycle of the AC power, "A" represents the threshold, "td" represents a period of time between the start of the first half-cycle and the first detection timing, and "Ic" represents a current value determined based on the signal output from the current sensor at the first detection timing.

3. The image forming apparatus according to claim 1, wherein the controller is further configured to:
  begin to supply the AC power from the AC power source to the first heater at a first specific timing in a third half-cycle before the first half-cycle, the first specific timing being a timing from which an absolute value of an alternating current flowing into the first heater is equal to or less than the threshold until an end of the third half-cycle;
  calculate an estimated peak current, based on a signal output from the current sensor at a second detection timing later than the first specific timing in the third half-cycle and the second detection timing, the estimated peak current being a maximum value of an estimated current, the estimated current being an absolute value of an alternating current estimated to flow into the first heater when it is assumed that the first heater is supplied with the AC power from a start until the end of the third half-cycle;
  determine whether the estimated peak current is equal to or less than the threshold;
  in response to determining that the estimated peak current is more than the threshold, begin to supply the AC power to the first heater at a second specific timing in a fourth half-cycle next to the third half-cycle, the second specific timing satisfying that a period of time between a start of the fourth half-cycle and the second specific timing is equal to a period of time between the start of the third half-cycle and a timing from which the estimated current is equal to or less than the threshold until the end of the third half-cycle; and
  in response to determining that the estimated peak current is equal to or less than the threshold, begin to supply the AC power to the first heater at the start of the fourth half-cycle.

4. The image forming apparatus according to claim 1, wherein the controller is further configured to:
  in response to determining that the estimated combined peak current is more than the threshold, calculate the second particular timing, the second particular timing satisfying that the period of time between the start of the second half-cycle and the second particular timing is shorter than a period of time between the start of the first half-cycle and the first particular timing.

5. The image forming apparatus according to claim 4, wherein the controller is further configured to calculate the second particular timing, using a formula "ton=T/2−A×(T−2td)/2Ic,"

where "T" represents a cycle of the AC power, "A" represents the threshold, "td" represents a period of time between the start of the first half-cycle and the first detection timing, "Ic" represents a current value determined based on the signal output from the current sensor at the first detection timing, and "ton" represents a period of time between the start of the second half-cycle and the second particular timing.

6. The image forming apparatus according to claim 5, wherein the controller is further configured to:
   determine whether the calculated second particular timing is earlier than a predefined timing;
   in response to determining that the calculated second particular timing is earlier than the predefined timing, begin to supply the AC power to the second heater at the predefined timing in the second half-cycle; and
   in response to determining that the calculated second particular timing is not earlier than the predefined timing, begin to supply the AC power to the second heater at the calculated second particular timing in the second half-cycle.

7. The image forming apparatus according to claim 4, wherein the controller is further configured to calculate the second particular timing in the second half-cycle, based on a signal output from the current sensor at a first sensing timing earlier than the first particular timing in the first half-cycle and a signal output from the current sensor at a second sensing timing in the second half-cycle.

8. The image forming apparatus according to claim 7, wherein the controller is further configured to calculate the second particular timing in the second half cycle, based on the signal output from the current sensor at the first sensing timing in the first half-cycle, the signal output from the current sensor at the second sensing timing in the second half-cycle, the first sensing timing, and the second sensing timing.

9. The image forming apparatus according to claim 8, wherein the controller is further configured to calculate the second particular timing in the second half cycle, using a formula "ton(n+1)=1/2×(T−A×(T−2td1)(T−2td)/(Icx(T−2td1)−(Itd1($n$)−Itd1($n$+1))×(T−2td)),"
   where "T" represents the cycle of the AC power, "A" represents the threshold, "td" represents the period of time between the start of the first half-cycle and the first detection timing, "Ic" represents a current value determined based on the signal output from the current sensor at the first detection timing, "td1" represents a period of time between the start of the first half-cycle and the first sensing timing and also represents a period of time between the start of the second half-cycle and the second sensing timing, "Itd1($n$)" represents a current value determined based on the signal output from the current sensor at the first sensing timing, "Itd1($n$+1)" represents a current value determined based on the signal output from the current sensor at the second sensing timing, and "ton(n+1)" represents the period of time between the start of the second half-cycle and the second particular timing.

10. The image forming apparatus according to claim 1, wherein power consumption of the first heater is larger than power consumption of the second heater.

11. The image forming apparatus according to claim 1, wherein the controller comprises:
    a processor; and
    a memory storing processor-executable instructions configured to, when executed by the processor, cause the processor to:
       begin to supply the AC power to the first heater at the start of the first half-cycle;
       begin to supply the AC power to the second heater at the first particular timing in the first half-cycle;
       calculate the estimated combined peak current;
       determine whether the estimated combined peak current is equal to or less than the threshold;
       in response to determining that the estimated combined peak current is more than the threshold, begin to supply the AC power to the second heater at the second particular timing in the second half-cycle; and
       in response to determining that the estimated combined peak current is equal to or less than the threshold, begin to supply the AC power to the second heater at the start of the second half-cycle.

12. A method implementable on a processor coupled with an image forming apparatus, the image forming apparatus comprising:
    a first heater;
    a second heater electrically connected in parallel with the first heater; and
    a current sensor electrically connected in series with the first heater and the second heater, the method comprising:
       beginning to supply AC power from an AC power source to the first heater at a start of a first half-cycle of the AC power, thereby causing an alternating current, of which an absolute value is equal to or less than a threshold from the start until an end of the first half-cycle, to flow into the first heater;
       beginning to supply the AC power to the second heater at a first particular timing after beginning to supply the AC power to the first heater, in the first half-cycle, the first particular timing being a timing from which a combined current is equal to or less than the threshold until the end of the first half-cycle, the combined current being a sum of absolute values of respective alternating currents flowing into the first heater and the second heater;
       calculating an estimated combined peak current, based on a signal output from the current sensor at a first detection timing later than the first particular timing in the first half-cycle and the first detection timing, the estimated combined peak current being a maximum value of an estimated combined current, the estimated combined current being a sum of absolute values of respective alternating currents estimated to flow into the first heater and the second heater when it is assumed that the first heater and the second heater are supplied with the AC power from the start until the end of the first half-cycle;
       determining whether the estimated combined peak current is equal to or less than the threshold;
       in response to determining that the estimated combined peak current is more than the threshold, beginning to supply the AC power to the second heater at a second particular timing in a second half-cycle next to the first half-cycle, the second particular timing satisfying that a period of time between a start of the second half-cycle and the second particular timing is equal to a period of time between the start of the first half-cycle and a timing from which the estimated combined current is equal to or less than the threshold until the end of the first half-cycle; and in response to determining that the estimated combined peak current is equal to or less than the threshold, beginning to supply the AC power to the second heater at the start of the second half-cycle.

13. A non-transitory computer-readable medium storing computer-readable instructions that are executable by a processor coupled with an image forming apparatus, the image forming apparatus comprising:

a first heater;

a second heater electrically connected in parallel with the first heater; and a current sensor electrically connected in series with the first heater and the second heater, the instructions being configured to, when executed by the processor, cause the processor to:

begin to supply AC power from an AC power source to the first heater at a start of a first half-cycle of the AC power, thereby causing an alternating current, of which an absolute value is equal to or less than a threshold from the start until an end of the first half-cycle, to flow into the first heater;

begin to supply the AC power to the second heater at a first particular timing after beginning to supply the AC power to the first heater, in the first half-cycle, the first particular timing being a timing from which a combined current is equal to or less than the threshold until the end of the first half-cycle, the combined current being a sum of absolute values of respective alternating currents flowing into the first heater and the second heater;

calculate an estimated combined peak current, based on a signal output from the current sensor at a first detection timing later than the first particular timing in the first half-cycle and the first detection timing, the estimated combined peak current being a maximum value of an estimated combined current, the estimated combined current being a sum of absolute values of respective alternating currents estimated to flow into the first heater and the second heater when it is assumed that the first heater and the second heater are supplied with the AC power from the start until the end of the first half-cycle;

determine whether the estimated combined peak current is equal to or less than the threshold;

in response to determining that the estimated combined peak current is more than the threshold, begin to supply the AC power to the second heater at a second particular timing in a second half-cycle next to the first half-cycle, the second particular timing satisfying that a period of time between a start of the second half-cycle and the second particular timing is equal to a period of time between the start of the first half-cycle and a timing from which the estimated combined current is equal to or less than the threshold until the end of the first half-cycle; and in response to determining that the estimated combined peak current is equal to or less than the threshold, begin to supply the AC power to the second heater at the start of the second half-cycle.

\* \* \* \* \*